(12) United States Patent
Tegen et al.

(10) Patent No.: US 7,851,356 B2
(45) Date of Patent: Dec. 14, 2010

(54) INTEGRATED CIRCUIT AND METHODS OF MANUFACTURING THE SAME

(75) Inventors: Stefan Tegen, Dresden (DE); Klaus Muemmler, Dresden (DE); Peter Baars, Dresden (DE); Uta Mierau, Radebeul (DE)

(73) Assignee: Qimonda AG, Munich (DE)

( * ) Notice: Subject to any disclaimer, the term of this patent is extended or adjusted under 35 U.S.C. 154(b) by 458 days.

(21) Appl. No.: 11/863,528

(22) Filed: Sep. 28, 2007

(65) Prior Publication Data

US 2009/0085084 A1    Apr. 2, 2009

(51) Int. Cl.
H01L 21/4763    (2006.01)

(52) U.S. Cl. ............... 438/637; 438/672; 257/E21.678

(58) Field of Classification Search ............... 438/637, 438/672, 618; 257/E21.678
See application file for complete search history.

(56) References Cited

U.S. PATENT DOCUMENTS

| 5,502,320 | A | 3/1996 | Yamada |
| 5,798,544 | A | 8/1998 | Ohya et al. |
| 5,895,239 | A | 4/1999 | Jeng et al. |
| 5,907,788 | A | 5/1999 | Kasai |
| 6,100,138 | A | 8/2000 | Tu |
| 6,191,975 | B1 | 2/2001 | Shimizu et al. |
| 6,545,904 | B2 | 4/2003 | Tran |
| 6,635,918 | B1 | 10/2003 | Narui et al. |
| 6,785,157 | B2 | 8/2004 | Arimoto et al. |
| 7,034,408 | B1 | 4/2006 | Schloesser |
| 2004/0173836 | A1* | 9/2004 | Oh et al. .................. 257/303 |
| 2004/0262769 | A1 | 12/2004 | Park |
| 2006/0255384 | A1 | 11/2006 | Baars et al. |
| 2006/0264002 | A1* | 11/2006 | Tran et al. .................. 438/401 |
| 2006/0292812 | A1* | 12/2006 | Jung et al. .................. 438/381 |
| 2007/0267723 | A1* | 11/2007 | Bernstein et al. ............. 257/621 |
| 2008/0145998 | A1* | 6/2008 | Delgadino et al. .......... 438/401 |

FOREIGN PATENT DOCUMENTS

WO    0101489 A1    1/2001

OTHER PUBLICATIONS

Quirk and Serda, "Semicondctor Manufacturing Technology," Prentice-Hall, 2001, pp. 462-463.*

* cited by examiner

Primary Examiner—Asok K Sarkar
Assistant Examiner—Julia Slutsker
(74) Attorney, Agent, or Firm—Edell, Shapiro & Finnan, LLC

(57) ABSTRACT

A method of manufacturing an integrated circuit includes forming landing pads in an array region of a substrate, individual ones of the landing pads being electrically coupled to individual ones of portions of devices formed in the substrate in the array region. The method also includes forming wiring lines within a peripheral region of the substrate. Forming the landing pads and forming the wiring lines includes a common lithographic process being effective in both the array and peripheral regions. The wiring lines and the landing pads of the integrated circuit are self-aligned.

11 Claims, 19 Drawing Sheets

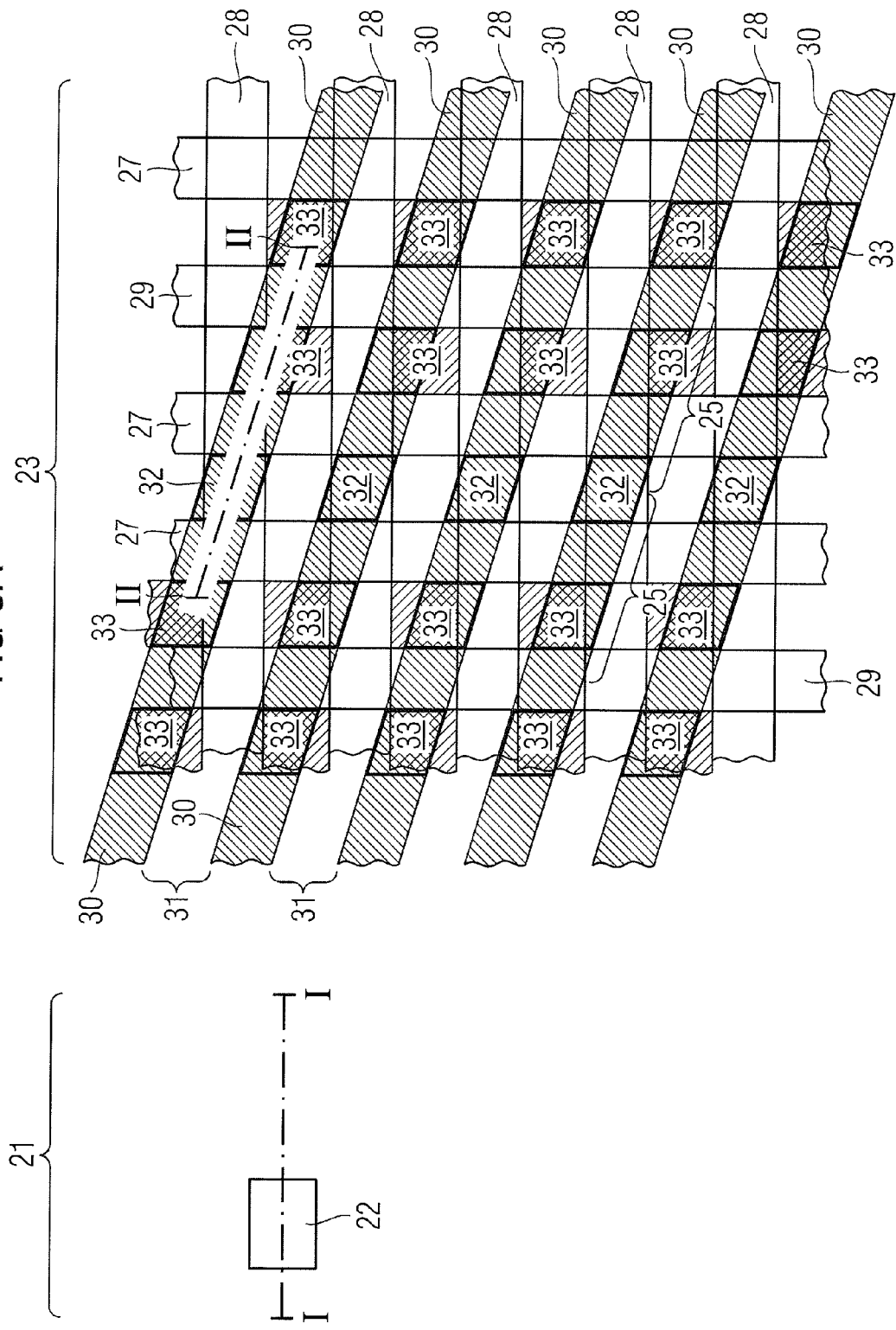

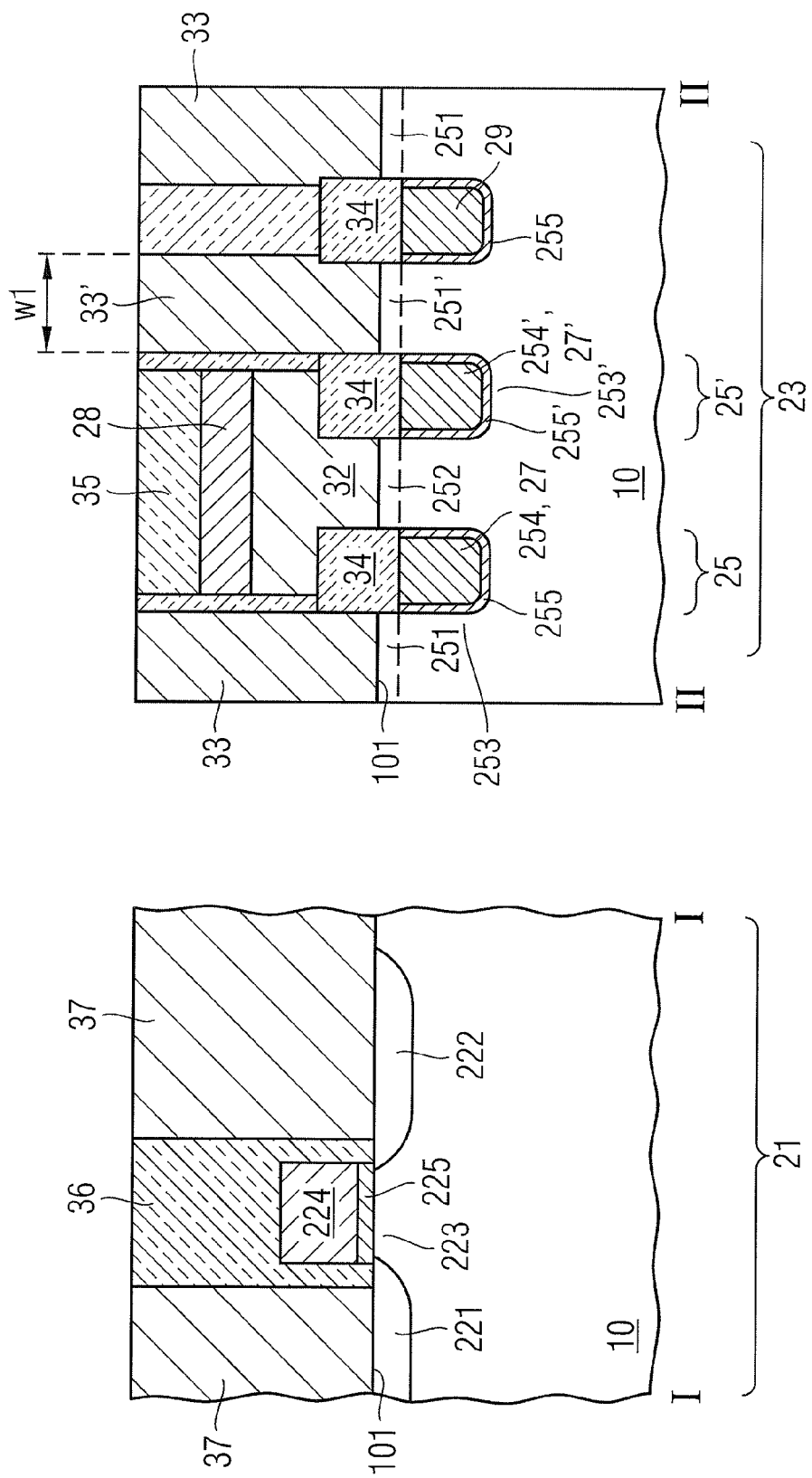

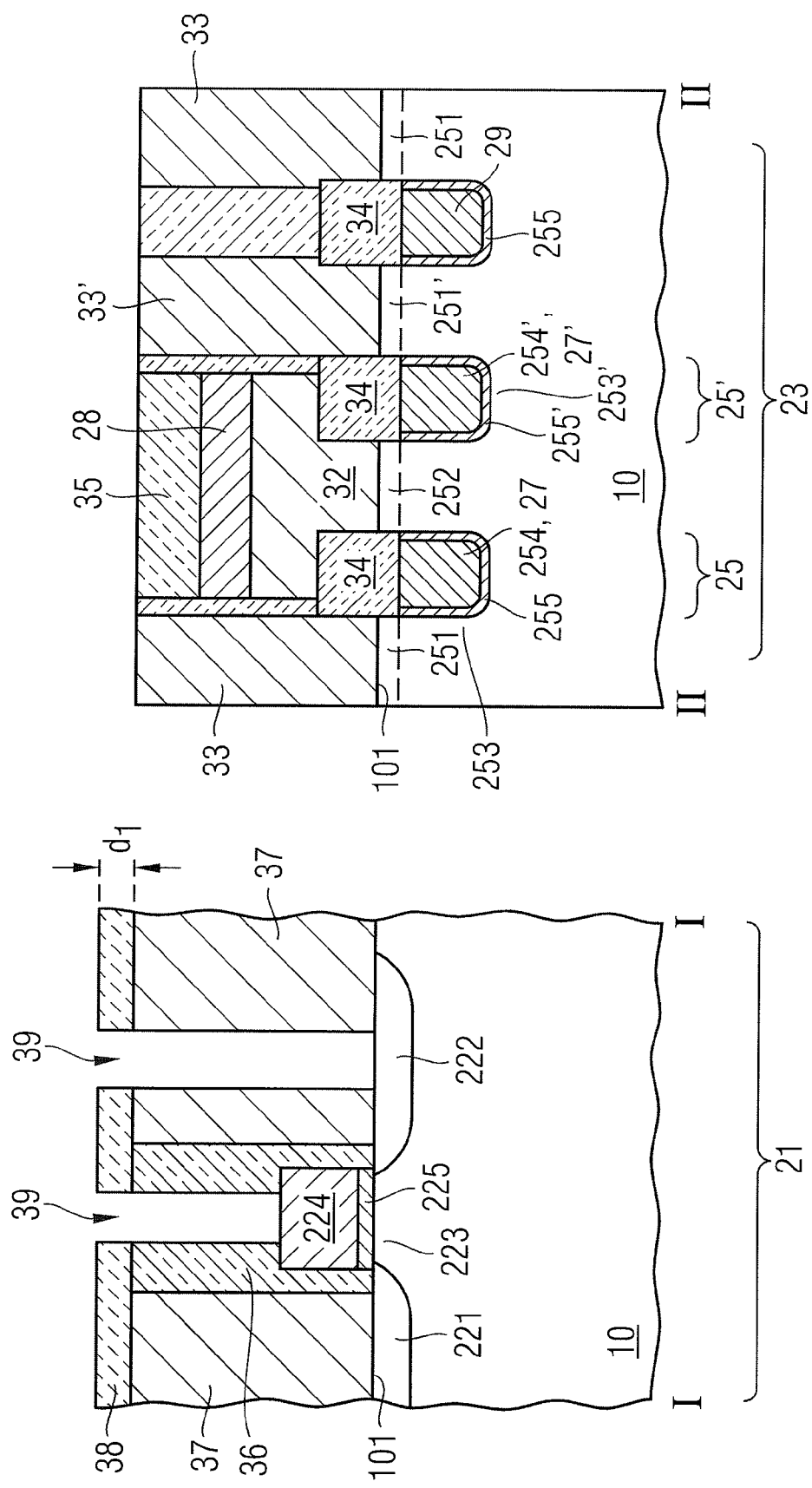

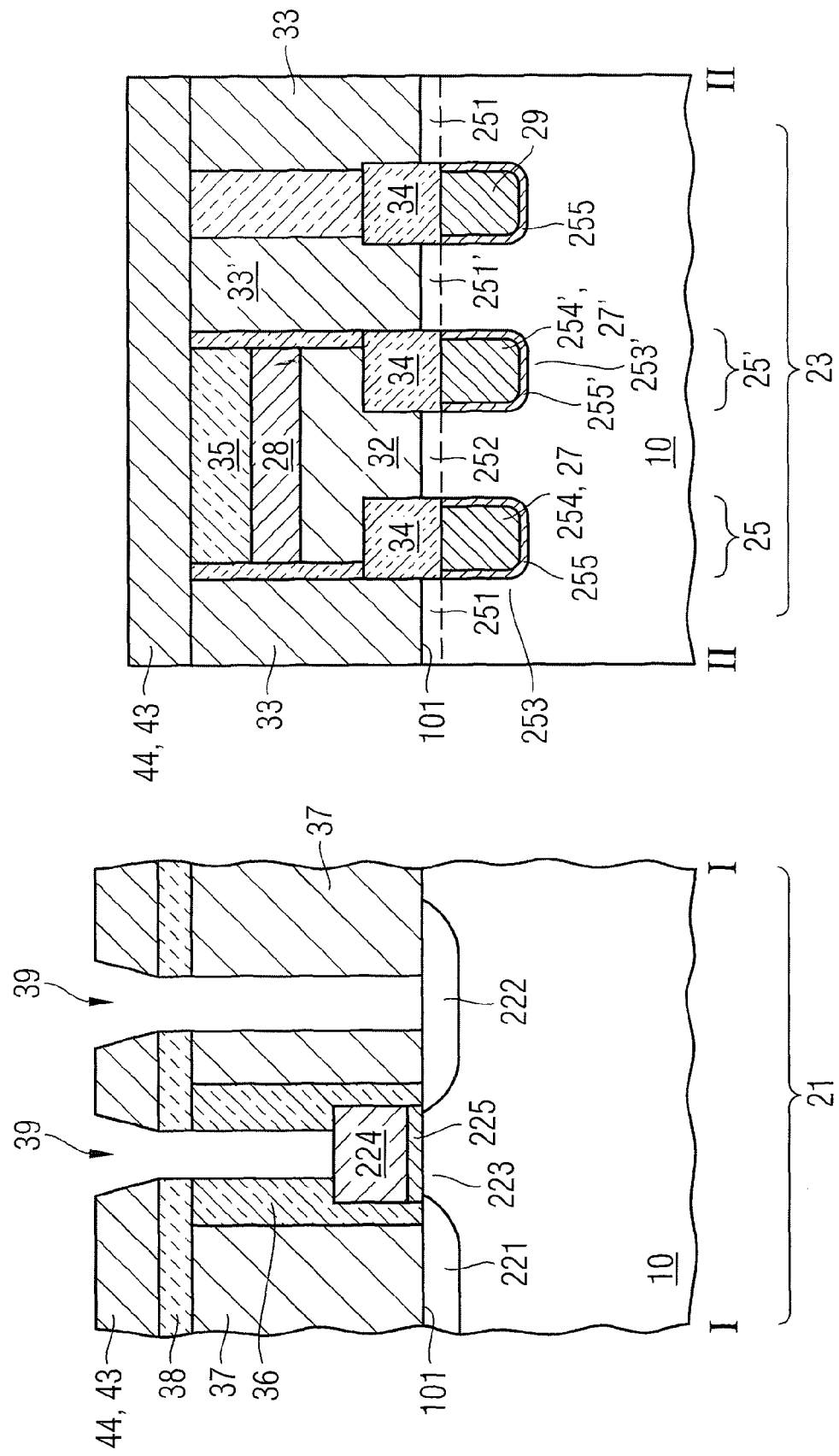

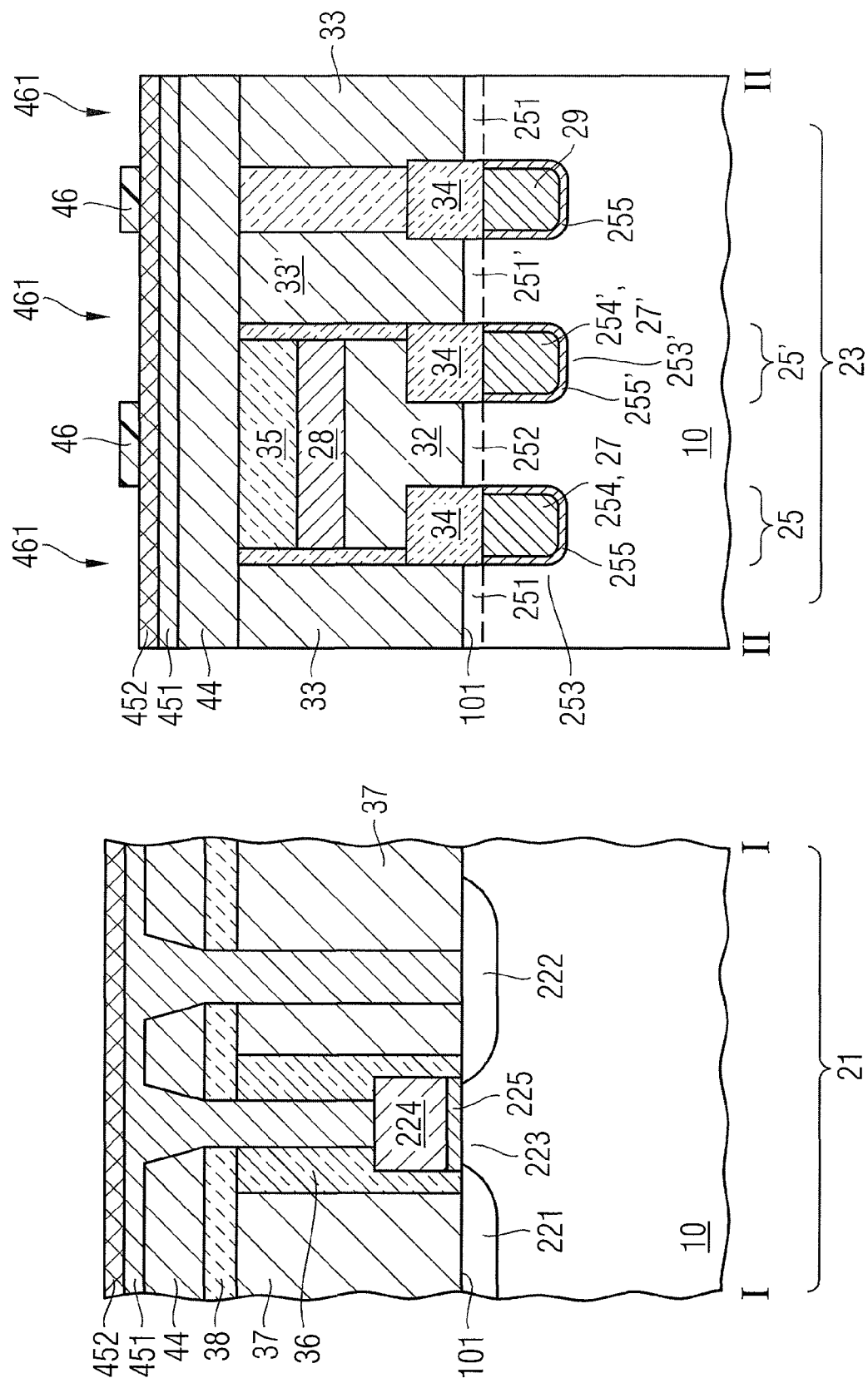

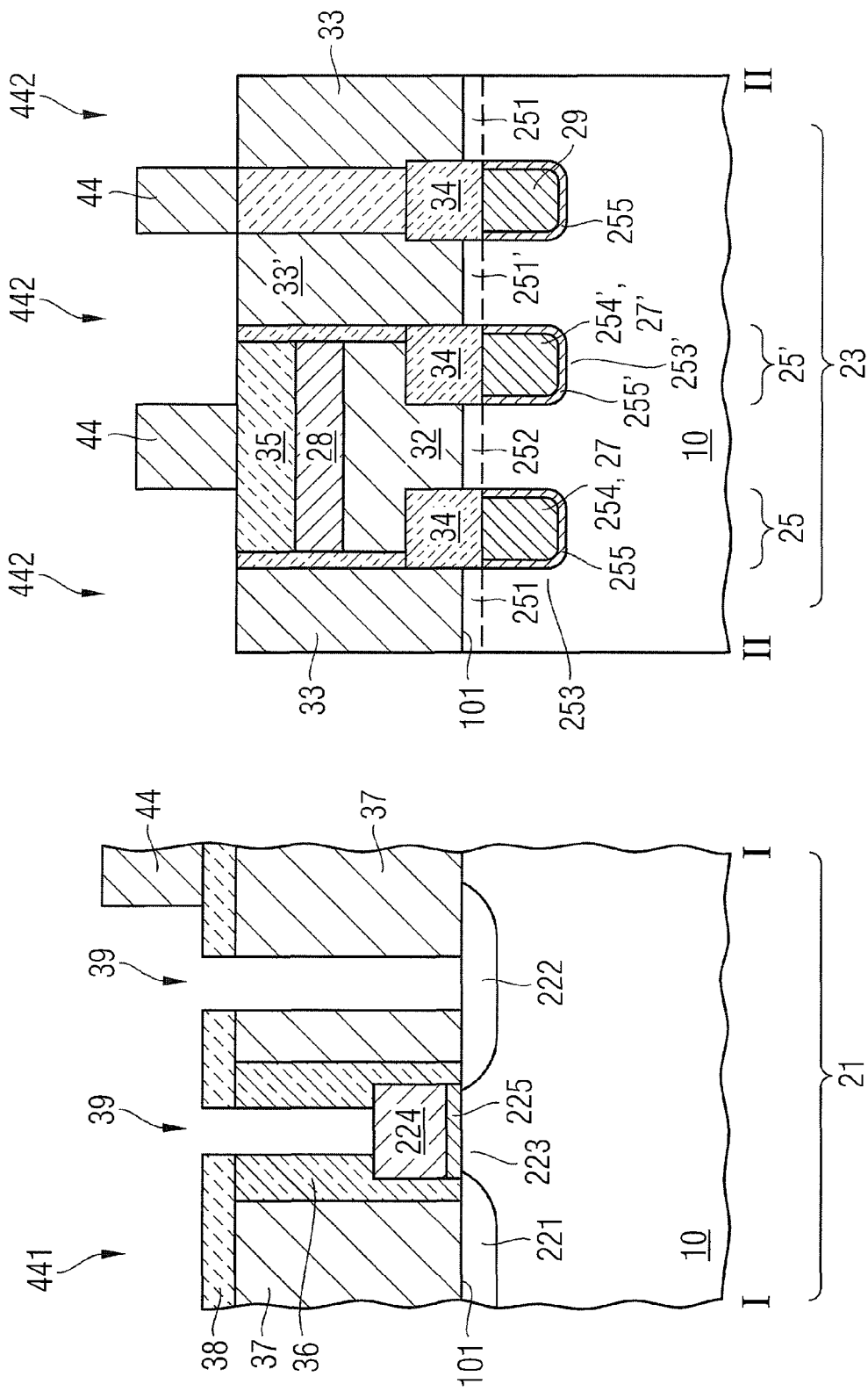

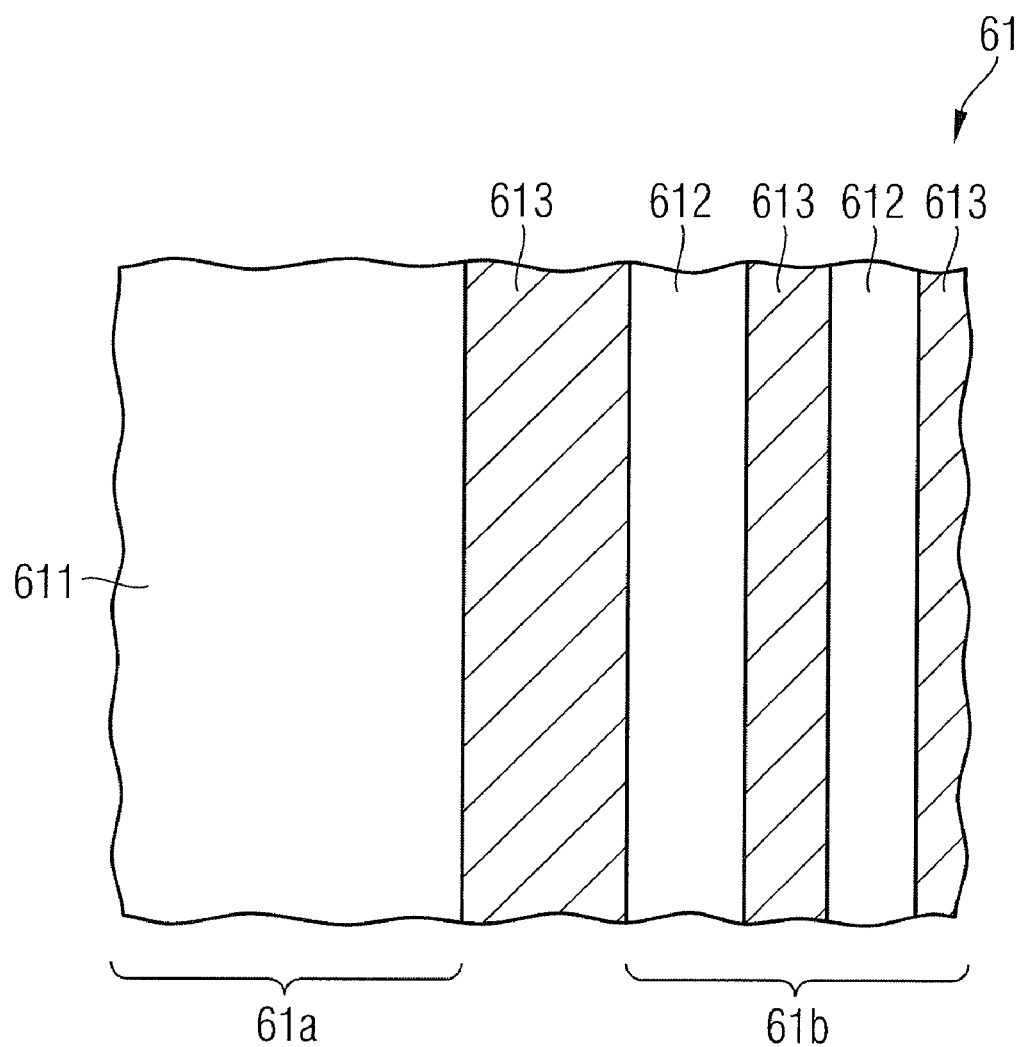

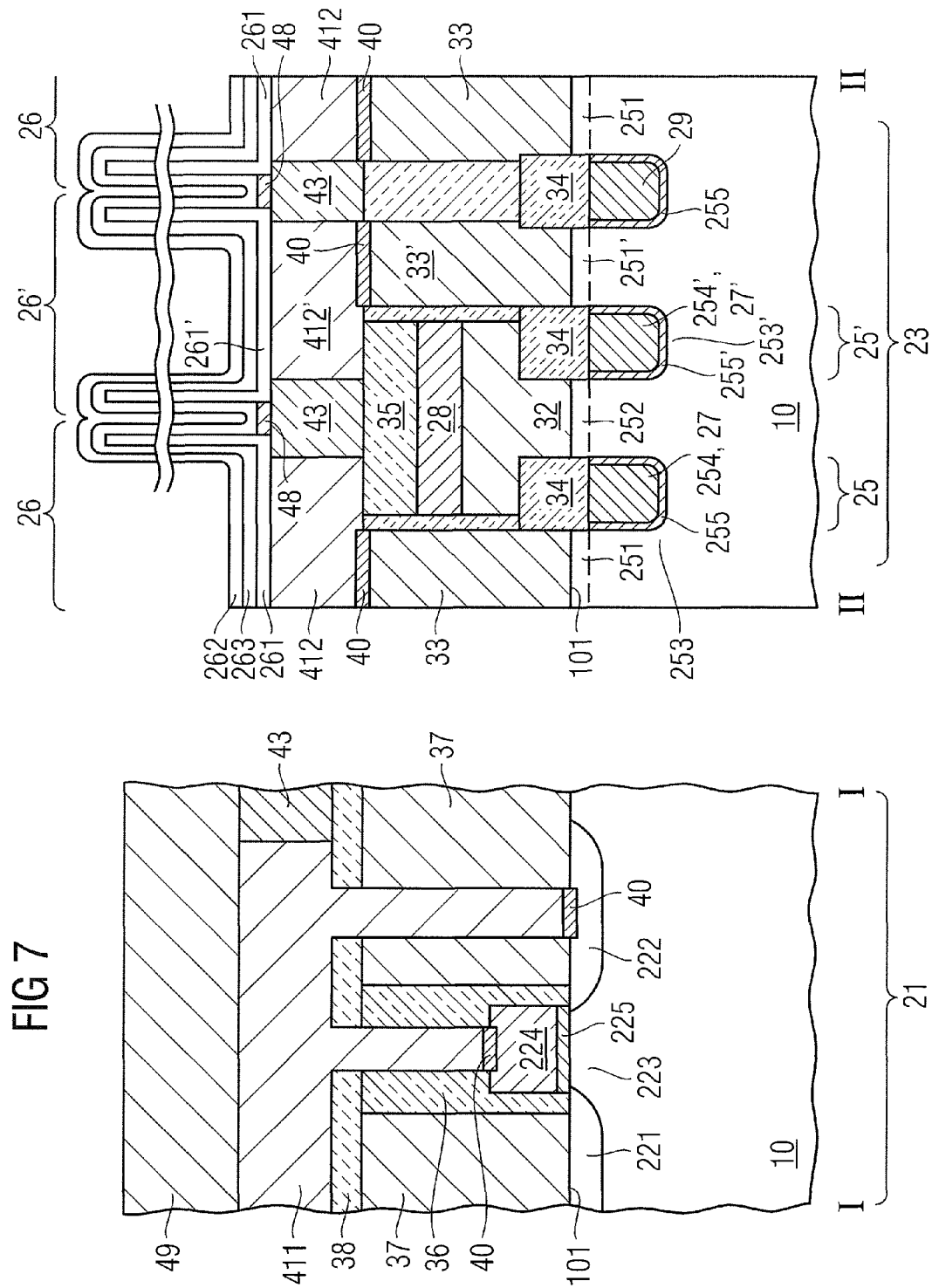

INTEGRATED CIRCUIT AND METHODS OF MANUFACTURING THE SAME

BACKGROUND

Integrated circuits may comprise a plurality of devices, like for instance transistors, or conductive lines or contact structures arranged in a regular pattern having for example an array-like geometry. The pattern may show small device dimensions and small pitches of the devices in order to save space on the wafer or carrier surface and costs. Devices, conductive lines or contact structures may be arranged in patterns having different geometries in different planes of an integrated circuit. For example, a pattern in a first plane may show regular line geometry, whereas a pattern in a second plane may show a matrix or checkerboard geometry. Transforming a first pattern into a second pattern (e.g., contacting devices, conductive lines or contact structures in different planes being arranged in different patterns) is challenging especially at small device dimensions and at small pitches near the minimum lithographic feature size obtainable by a specific technology.

Integrated circuits may comprise devices in an array region as described above and devices in a peripheral region. For example, an integrated circuit may comprise memory cells arranged in an array region and devices, like transistors or others, which are configured to control read and write operations of the memory cell array, in a peripheral region. A need exists for a common processing of structures in the array region and in the peripheral region (i.e., for a processing being effective in both regions).

SUMMARY

Described herein are an integrated circuit and a method of manufacturing an integrated circuit. The method comprises forming landing pads in an array region of a substrate, individual ones of the landing pads being electrically coupled to individual ones of portions of devices formed in the substrate in the array region, and forming wiring lines within a peripheral region of the substrate, wherein forming the landing pads and forming the wiring lines comprises a common lithographic process being effective in both the array and the peripheral regions. The wiring lines and the landing pads of the integrated circuit are self-aligned.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings are included to provide a further understanding of exemplary embodiments and are incorporated in and constitute a part of this specification. Emphasis is placed upon showing the principles of the described methods and integrated circuits. The drawings illustrate exemplary embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

FIGS. 3A to 3F illustrate cross-sectional views and corresponding plan views of an integrated circuit at different stages of processing according to an exemplary embodiment of the method.

FIGS. 5A to 5E illustrate cross-sectional views and corresponding plan views of an integrated circuit at different stages of processing according to another exemplary embodiment of the method.

FIG. 6A illustrates a first photomask of a set of photomasks used in the method of FIGS. 5A to 5E.

FIG. 7 illustrates a cross-sectional view of an integrated circuit which can be obtained by an exemplary embodiment of the described method.

DETAILED DESCRIPTION

In the following paragraphs, exemplary embodiments of a method for manufacturing an integrated circuit and an exemplary embodiment of the integrated circuit are described in connection with the figures.

Figure 1:
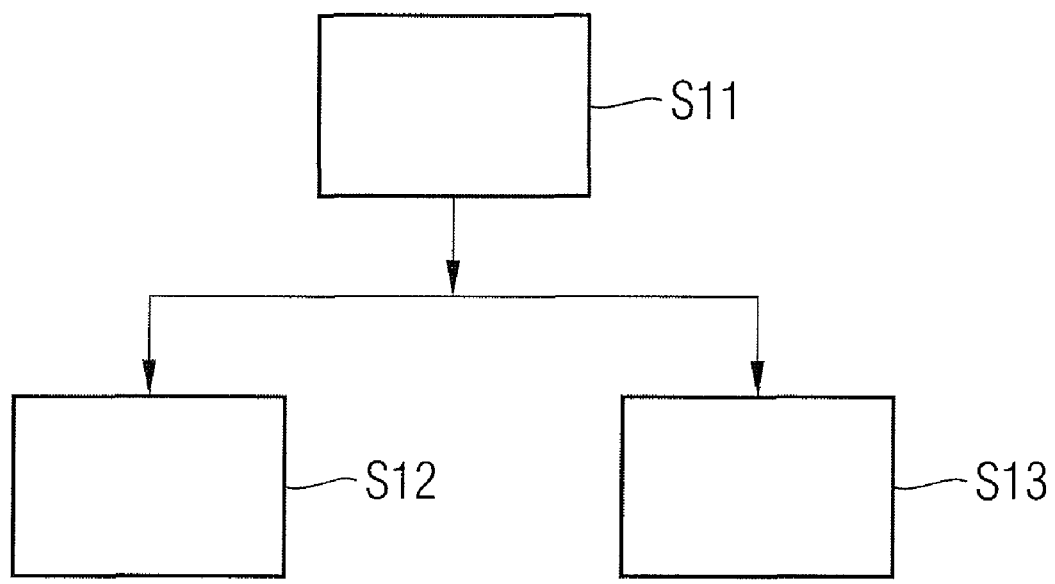
FIG. 1 illustrates a flow diagram of a method of manufacturing an integrated circuit.

FIG. 1 illustrates a flow diagram of an embodiment of a method for manufacturing an integrated circuit. The method comprises providing a substrate or a carrier comprising a plurality of devices formed in an array region (S11). This processing step may comprise forming a plurality of contact portions in the array region of a substrate, wherein individual ones of the contact portions may be in contact with individual ones of portions of the devices. Such contact portions may be, for example, contact plugs. Thereafter a plurality of landing pads is formed in the array region (S12), and wiring lines are formed in a peripheral region of the substrate (S13). Individual ones of the landing pads are electrically coupled to individual ones of the portions of the devices. The landing pads may be in contact with the contact portions and may be formed above the contact portions. Nevertheless, the landing pads may be formed in direct contact to the portions of the devices. Forming the landing pads and forming the wiring lines comprise a common lithographic process which is effective in both the array and the peripheral region. The contact portions, landing pads and wiring lines are made of conductive materials, which may be different for contact portions, landing pads or wiring lines. According to another embodiment the landing pads and the wiring lines are made of the same materials.

Furthermore, forming the landing pads and forming the wiring lines may comprise a common (i.e., joint) process for patterning a layer of a conductive material. This patterning process may comprise, for instance, a common etching step of a conductive layer or a common step of filling structures with a conductive material and removing excessive conductive material.

The common (i.e., joint) lithographic process may be carried out subsequent or prior to providing a conductive material for landing pads and wiring lines. In one embodiment, a conductive layer may be provided above the array region and the peripheral region, wherein the conductive layer is electrically coupled to the portions of the devices. The conductive layer may be in contact with contact portions (e.g., contact plugs) as described above. The conductive layer may be a layer stack that comprises a plurality of layers of different conductive materials. The conductive layer may be the same layer in the array and the peripheral region, but may also comprise different materials in the array region on one hand and in the peripheral region on the other hand. Then, a masking layer is provided above the conductive layer and patterned by carrying out the common lithographic process to form patterns within the masking layer. In the array region, the patterns within the masking layer are landing pad structures corresponding to the landing pads, and in the peripheral region the patterns within the masking layer are wiring line structures corresponding to the wiring lines. Subsequently, the conductive layer is patterned according to the patterned masking layer, for instance by using the patterned masking layer as an etching mask.

If the material of the contact portions or the portions of the devices is a semiconductor material, a metal-semiconductor compound may be formed on a top surface of the contact portions or the portions of the devices prior to providing the conductive layer. Thus the contact resistance between the contact portions or the portions of the devices and the landing pads may be decreased. Nevertheless, the contact portions or the portions of the devices may comprise another conductive material, as for instance a metal, a metal nitride, or a metal carbide.

According to another embodiment, a masking layer is provided above the array and the peripheral region. The masking layer may be provided directly on top of the portions of the devices or of the contact portions. The masking layer may be a layer stack comprising different materials. The masking layer is patterned by carrying out the common lithographic process. Thus structures are formed within the masking layer, wherein the structures in the array region are holes having the shape of the landing pads, which are to be formed, and wherein the structures in the peripheral region are trenches having the shape of the wiring lines, which are to be formed. The structures in the array region may extend to a top surface of the portions of the devices or of the contact portions. Subsequently, a conductive material is provided, which at least partially fills the structures within the masking layer. The layer of the conductive material may be formed thinner than the masking layer. The layer of the conductive material may be thinner than, equal to or thicker than the masking layer. Excessive conductive material disposed on the masking layer or extending above the masking layer may be removed, for example by a CMP—(Chemical mechanical polishing) process using the masking layer as a planarization stop.

If the material of the portions of the device or of the contact plugs is a semiconductor material, a metal-semiconductor compound may be formed on a top surface of the contact plugs prior to providing the conductive material.

The masking layer may comprise a resist layer system, for instance a radiation sensitive resist with an optional antireflective coating layer. According to other embodiments, the masking layer may be a layer stack and may comprise one or more hard mask layers, like a layer of silicon nitride, silicon oxide or carbon, by way of example.

According to another embodiment, the common lithographic process comprises a first lithographic exposure process using a first mask and a second lithographic exposure process using a second mask. The first mask comprises first line structures assigned to the array region and wiring line structures assigned to the peripheral region. The second mask comprises second line structures in the array region and a block structure in the peripheral region. The first and the second mask are aligned to each other with respect to the substrate such that the projected second line structures intersect the projected first line structures.

The terms "first" mask and "second" mask are used to differ the masks from each other and are not used to describe a chronological order of the use of the masks.

The first and the second lithographic exposure process may be effective on one resist layer system, wherein both exposure processes may be carried out into the same resist layer system (double exposure process).

The term "resist layer system" is used to describe a layer system comprising a layer of a radiation sensitive material. The resist layer system may further comprise a hard mask layer or other layers.

According to a further embodiment, a first resist layer system may be exposed by the first lithographic exposure process, and a second resist layer system may be exposed by the second lithographic exposure process. The first resist layer system may be developed after imaging the structures of the first mask into the first resist layer system to form first resist structures that may be transferred into an underlying masking layer before exposing the second resist layer system (double lithography process).

The optical properties of the structures in the first and the second mask are selected according to the used resist layer systems and the desired structures in the masking layer. If, for example, the resist layer system is a positive resist, a double exposure process may be performed, and the desired structures in the masking layer may be dot and line structures used as an etching mask for etching an underlying conductive layer. Then the first line structures and the wiring line structures in the first mask and the second line structures and the block structure in the second mask are opaque structures surrounded by transparent regions.

According to an embodiment, the devices formed in the array region are access transistors of memory cells and the portions of the devices are source/drain regions of the transistors. The method may further comprise forming first and second conductive lines in the array region and forming storage capacitors above the access transistors in the array region. Individual ones of the storage capacitors comprise a first and a second capacitor electrode and a capacitor dielectric disposed between the first and the second capacitor electrode. The first or the second capacitor electrode of an individual one of the storage capacitors is electrically coupled to an individual one of the landing pads and electrically coupled to one source/drain region of an individual one of the access transistors.

Figure 2:
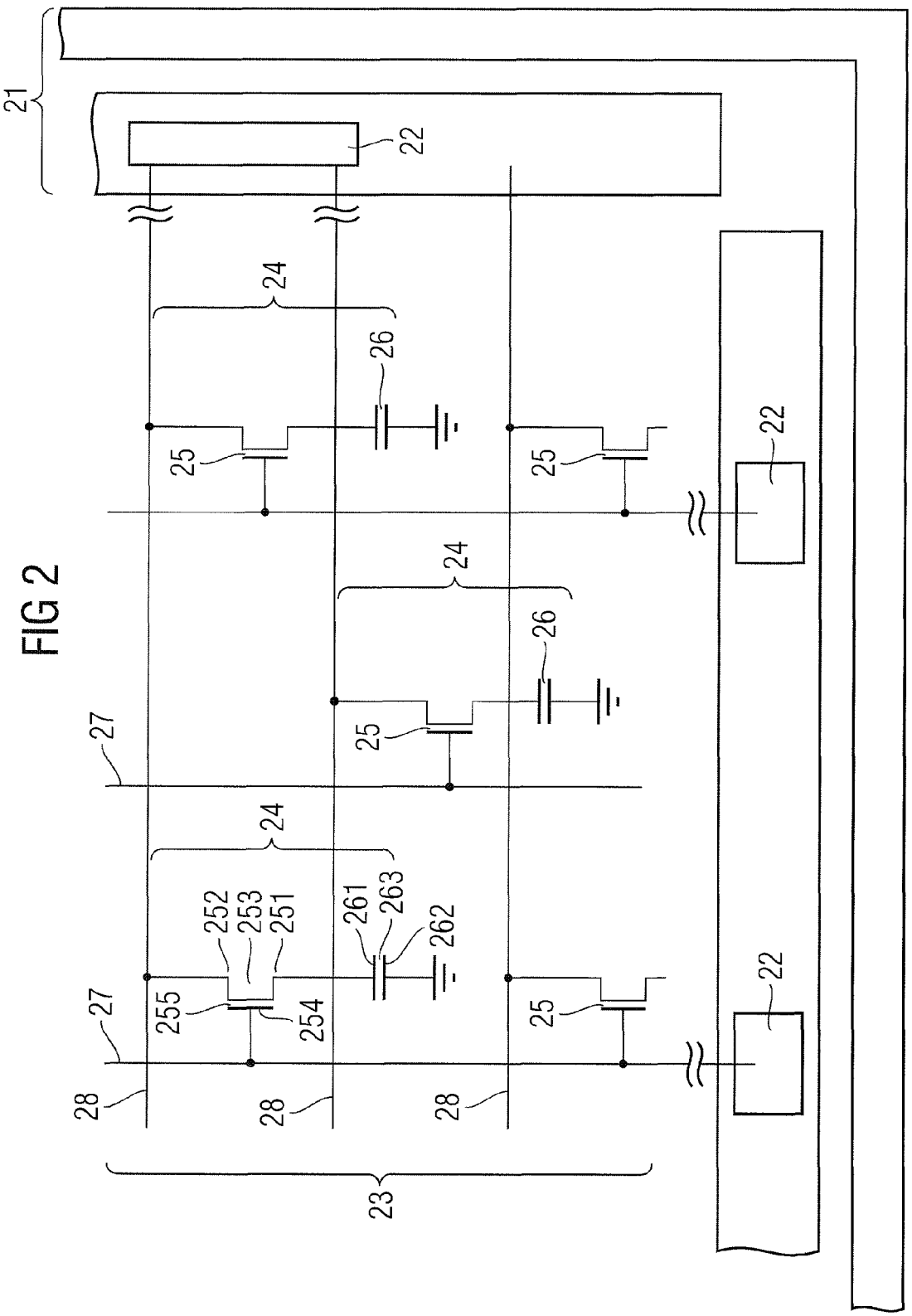
FIG. 2 illustrates a schematic view on an integrated circuit.

The above described embodiment may be used for manufacturing a memory device. FIG. 2 illustrates a schematic view on an embodiment of such a memory device, for instance a DRAM memory device. The memory device may, for instance, comprise a memory cell array in an array region 23 comprising memory cells 24. The memory device may further comprise a peripheral region 21 comprising control devices. Each of the memory cells 24 includes a storage capacitor 26 and an access transistor 25. The storage capacitor 26 includes first and second capacitor electrodes 261, 262 and a capacitor dielectric 263 disposed between the first and the second capacitor electrode 261, 262. The first capacitor electrode 261 is connected to a first source/drain region 251 of the access transistor 25. A channel 253 is formed between the first and a second source/drain region 251, 252. A gate electrode 254 controls the conductivity of the channel 253. A gate dielectric layer 255 insulates the gate electrode 254 from the channel 253. By addressing the access transistor 25 via a corresponding first conductive line 27, the information stored in the storage capacitor 26 is read out to a corresponding second conductive line 28. The first conductive line 27 may be a word line and the second conductive line 28 may be a bit line. The layout shown in FIG. 2 corresponds to the folded bit line layout. However, any kind of memory cell array layout may be formed.

The peripheral region 21 refers to a region at the edge of the memory cell array in which support circuits or control devices 22, such as decoders, sense amplifiers, and word line drivers for activating a word line may be located. Generally, the peripheral region 21 of a memory device includes circuitry for addressing memory cells 24 and for sensing and processing the signals received from the individual memory cells 24.

The access transistors 25 may be formed at least partially in a substrate or carrier, for example a semiconductor substrate. The term "substrate" used in the following description may include any semiconductor-based structure that has a semiconductor surface. Substrate and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor may be, for example, silicon, silicon-germanium, germanium, or gallium arsenide. The control devices 22 may be formed in the same substrate as the access transistors 25.

Referring to FIGS. 3A to 3F, an embodiment of the method will be explained using a plan view and cross-sectional views of an integrated circuit at different stages of processing. The integrated circuit shown in FIGS. 3A to 3F may be a memory device as described with respect to FIG. 2. A substrate comprising access transistors and first and second conductive lines in an array region and control devices in a peripheral region is provided.

FIG. 3A illustrates a plan view on a section of the substrate at this processing stage. At the left side, FIG. 3A shows the peripheral region 21, which comprises a control device 22. At the right side, FIG. 3A shows the array region 23 comprising access transistors 25, first conductive lines 27, second conductive lines 28, and isolation lines 29. The first conductive lines 27 extend along a first direction. The second conductive lines 28 extend in a second direction intersecting the first direction. According to this embodiment, the second direction is perpendicular to the first direction. In addition, continuous active area lines 30 are disposed at a slanted angle with respect to the first and second conductive lines 27, 28, respectively. The active area lines 30 extend continuously from one edge to another edge of the memory cell array. Neighbouring active area lines 30 are separated and electrically insulated from each other by isolation trenches 31 which are filled with an insulating material, for example silicon dioxide.

The isolation lines 29 extend parallel to the first conductive lines 27, wherein an individual isolation line 29 is disposed between a pair of neighbouring first conductive lines 27. The first and second conductive lines 27, 28, the isolation lines 29, the active area lines 30, and the isolation trenches 31 are formed with a width equal to or about 1 F, wherein F denotes the minimum lithographic feature size obtainable with a specific used technology.

According to FIG. 3A, two neighbouring access transistors 25 share one common contact 32 to the second conductive line 28. The contact 32 is connected with one of the source/drain regions of each of the access transistors 25. Each active area line 30 crosses a plurality of second conductive lines 28, thus forming a plurality of contacts 32 with different second conductive lines 28. Neighbouring contacts 32, which are connected to the same active area line 30, are connected with different second conductive lines 28.

In between two first conductive lines 27 and two second conductive lines 28, contact plugs 33 are formed above the active area lines 30 such that the contact plugs 33 are connected with the other one of the source/drain regions of each of the access transistors 25. The contact plugs 33 may have a width in the first and the second direction of 1 F or near 1 F. The width of the contact plugs 33 in one direction may be smaller than 1.5 F.

Nevertheless, the continuous active area lines 30 can as well be implemented as angled lines, instead of the straight lines shown in FIG. 3A. For example, the active area lines can comprise horizontal sections and slanted sections tilted against the horizontal sections. Alternatively, the active area lines 30 can be implemented as angled lines having two different angles with respect to the second conductive lines 28, both angles being different from 0°. Alternatively, the active area lines 30 and the second conductive lines 28 can be formed in a weaving manner, so that there are many points of intersection between a specific active area line 30 and a specific second conductive line 28. At each point of intersection between an active area line 30 and a second conductive line 28, a contact 32 may be formed.

FIG. 3B is a cross-sectional view of the substrate of FIG. 3A. The left side of FIG. 3B shows a cross-section through the peripheral region 21 comprising the control device 22 along line I-I as indicated in FIG. 3A. The right side of FIG. 3B shows a cross-section through the array region 23 along an active area line 30 as indicated by the line II-II in FIG. 3A. The control device 22 may for instance be formed as a transistor partially formed within a substrate 10. The transistor may comprise a source and a drain region 221, 222 formed within the substrate 10 and a channel region 223 formed within the substrate 10 in between the source and the drain region 221, 222. A gate electrode 224 may be formed above a surface 101 of the substrate 10, and a gate dielectric 225 insulates the gate electrode 224 from the channel region 223. The gate electrode 224 is configured to control the conductivity of the channel region 223. Insulating materials 36 and 37 are formed above the gate electrode 224 and the substrate surface 101.

In the array region 23, two neighboring access transistors 25, 25' are formed partially within the substrate 10. Each access transistor 25, 25' comprises a first source/drain region 251, 251' and a second source/drain region 252, which both access transistors 25, 25' share. Each access transistor 25, 25' comprises a channel region 253, 253' formed in the substrate 10 and separating the first and the second source/drain region 251, 251' and 252. Gate electrodes 254, 254' are formed as buried electrodes beneath the substrate surface 101. A gate dielectric 255, 255' insulates each gate electrode 254, 254' from the channel region 253, 253', respectively. The gate electrodes 254, 254' form neighboring first conductive lines 27 and 27'. The access transistors 25, 25' are insulated from neighboring access transistors arranged in the same active area line by an isolation line 29. The isolation line 29 may be formed in the same way as the first conductive lines 27, 27' insulated from the substrate 10 by an insulating material 295, which may be the same material that forms the gate dielectrics 255 and 255', as shown in FIG. 3B, or may be formed as an insulating line comprising an insulating material.

A contact 32 connects the second source/drain region 252 with a second conductive line 28. The first source/drain regions 251 and 251' are connected with a contact plug 33, 33' respectively. The first conductive lines 27, 27', the second conductive line 28 and the contact plugs 33, 33' are insulated from each other by an insulating material 34. The insulating material 34 may be formed of different materials at different places within the array region 23. Above the second conductive line 28, an insulating material 35 is disposed.

According to another embodiment, no contact plugs are formed, and landing pads, which will eventually be formed, may be arranged in direct contact to the first source/drain regions 251 and 251'.

The first conductive lines 27, 27', the second conductive line 28, the contact 32 and the contact plugs 33, 33' may be formed of a conductive material or of a layer stack of different conductive materials. Conductive materials may be, for example, a semiconductor material, for instance polysilicon, metals, for instance Ti, W, Ta or others, metal-semiconductor compounds or metal-compounds, for example TiN. The gate dielectrics 255, 255' may be formed of any suited dielectric material, for instance silicon oxide, silicon nitride, silicon oxynitride, high-k dielectrics, like $ZrO_x$ or $HfO_x$, or others. The insulating materials 34 and 35 may be formed of a dielectric material, for instance silicon oxide, silicon nitride, silicon oxynitride or others.

The contact plugs 33, 33' or a contact portion of the source/drain regions 251, 251' may have a width w1 measured parallel to the substrate surface 101, wherein the width w1 may be smaller than 1.5 F. The width may be equal to 1 F or may be between 1 F and 1.5 F.

Referring to FIG. 3C, an insulating layer 38 may be formed on top of the insulating layers 36 and 37 in the peripheral region 21. The insulating layer 38 may be made of any suitable insulating material, for instance BPSG, SOD (Spin-On Dielectric), silicon oxide or silicon nitride, and may have a thickness d1 (e.g., where: $10\,nm \leq d1 \leq 50\,nm$). The insulating layer 38 may serve as a shielding layer for the devices 22 as described above with respect to wiring lines disposed above the devices 22. Furthermore, the insulating layer 38 may serve as an etch stop in further processing. The insulating layer 38 may be formed by a deposition process, (e.g., CVD (Chemical vapor deposition)). It may be formed across the whole substrate 10 or only in the peripheral region 21. If it is formed across the whole substrate 10, it is removed from the array region 23, (e.g., via a lithographic pattern process followed by an etch process). According to another embodiment, the formation of the insulating layer 38 may be omitted.

Contact holes 39 are formed in the peripheral region 21 wherein surfaces of the devices 22 which have to be contacted in further processing are exposed. FIG. 3C shows that the contact holes 39 may extend to upper surfaces of the gate electrode 224 and the source/drain region 222. The contact holes 39 may have a circular, an oval, a rectangular or any other shape in a plan view. The contact holes 39 may be formed by an etch process.

Figure 3D:
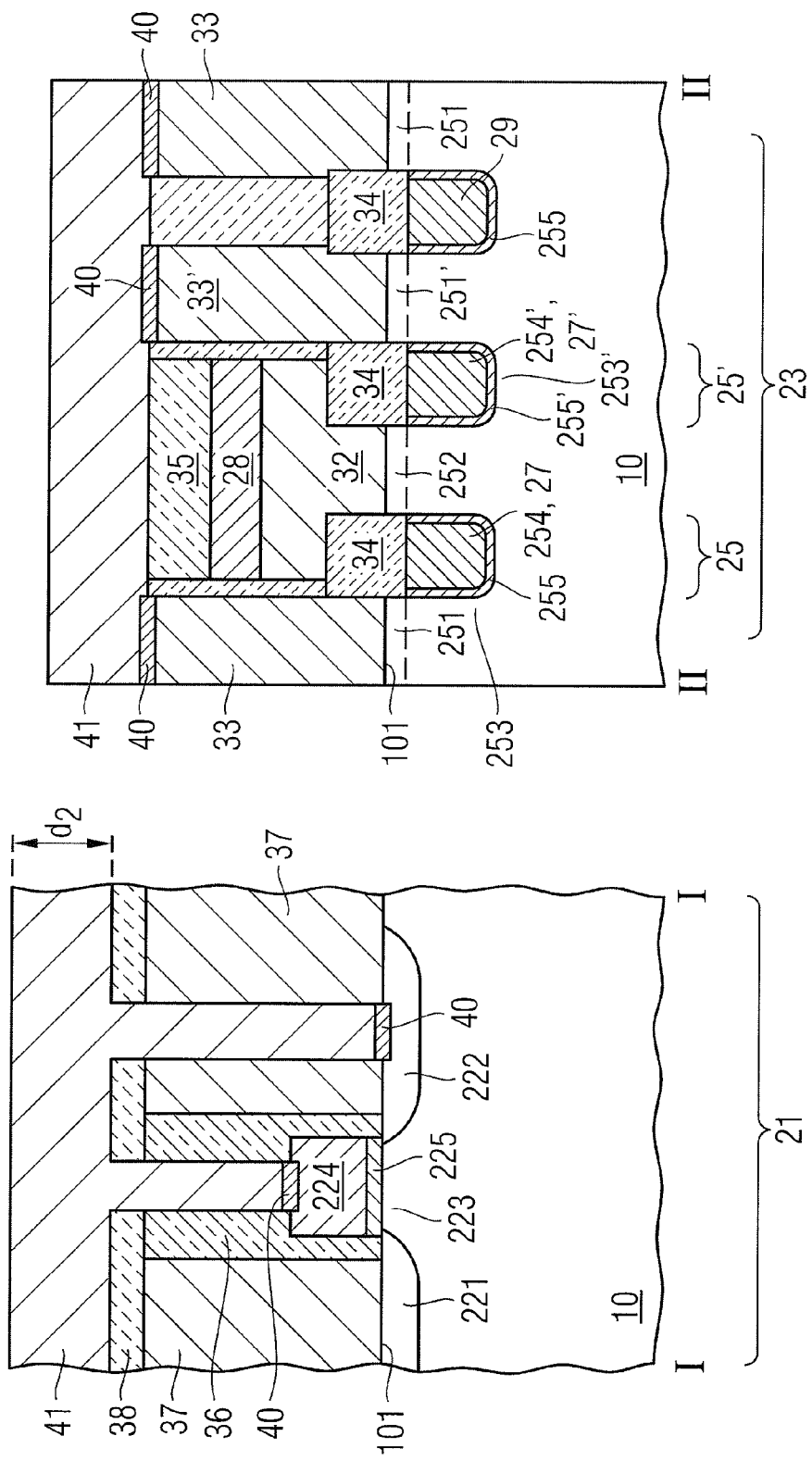

Referring to FIG. 3D, a conductive layer 41 may be provided above the peripheral and the array region 21, 23. The conductive layer 41 fills the contact holes 39 in the peripheral region 21 and is in contact with the contact plugs 33, 33' in the array region 23. Optionally, if the contact plugs 33, 33' are made of a semiconductor material, a metal-semiconductor compound 40 may be formed before providing the conductive layer 41. The metal-semiconductor compound 40 may be formed on a top surface of all structures made of a semiconductor material. The metal-semiconductor compound 40 may be formed on top of the contact plugs 33, 33' in the array region 23 and on top of the gate electrode 224 and the source/drain region 222 in the peripheral region 21. The metal-semiconductor compound provides a low resistivity interface between the conductive layer 41 and the contact plugs 33, 33' and may reduce an interaction between the material of the conductive layer 41 and the material of the contact plugs 33, 33' that might result in a high resistivity interface or other undesired effects. If the semiconductor material is silicon-based, the metal-semiconductor compound may be a silicide formed by providing a metal, for instance Ti, and performing a temperature process to form a silicide, for instance TiSi.

The conductive layer 41 may comprise any suitable conductive material, such as a metal, for example W or Cu, a metal-semiconductor compound (e.g., WSi), an electrically conductive nitride, (e.g., TiN or WN), or an electrically conductive carbide or others. The conductive layer 41 may be a layer stack comprising layers of different materials as described above. The conductive layer 41 may be made of a common material in both the peripheral and the array region 21, 23. Nevertheless, the conductive layer 41 may comprise different materials in the peripheral region 21 with respect to the materials in the array region 23. The conductive layer 41 may have a thickness d2 (e.g., where: $20\,nm \leq d2 \leq 120\,nm$). D2 may be the same in the peripheral region 21 and in the array region 23. Nevertheless, in the peripheral region 21, d2 may deviate from the thickness of the conductive layer 41 in the array region 23.

Figure 3E:
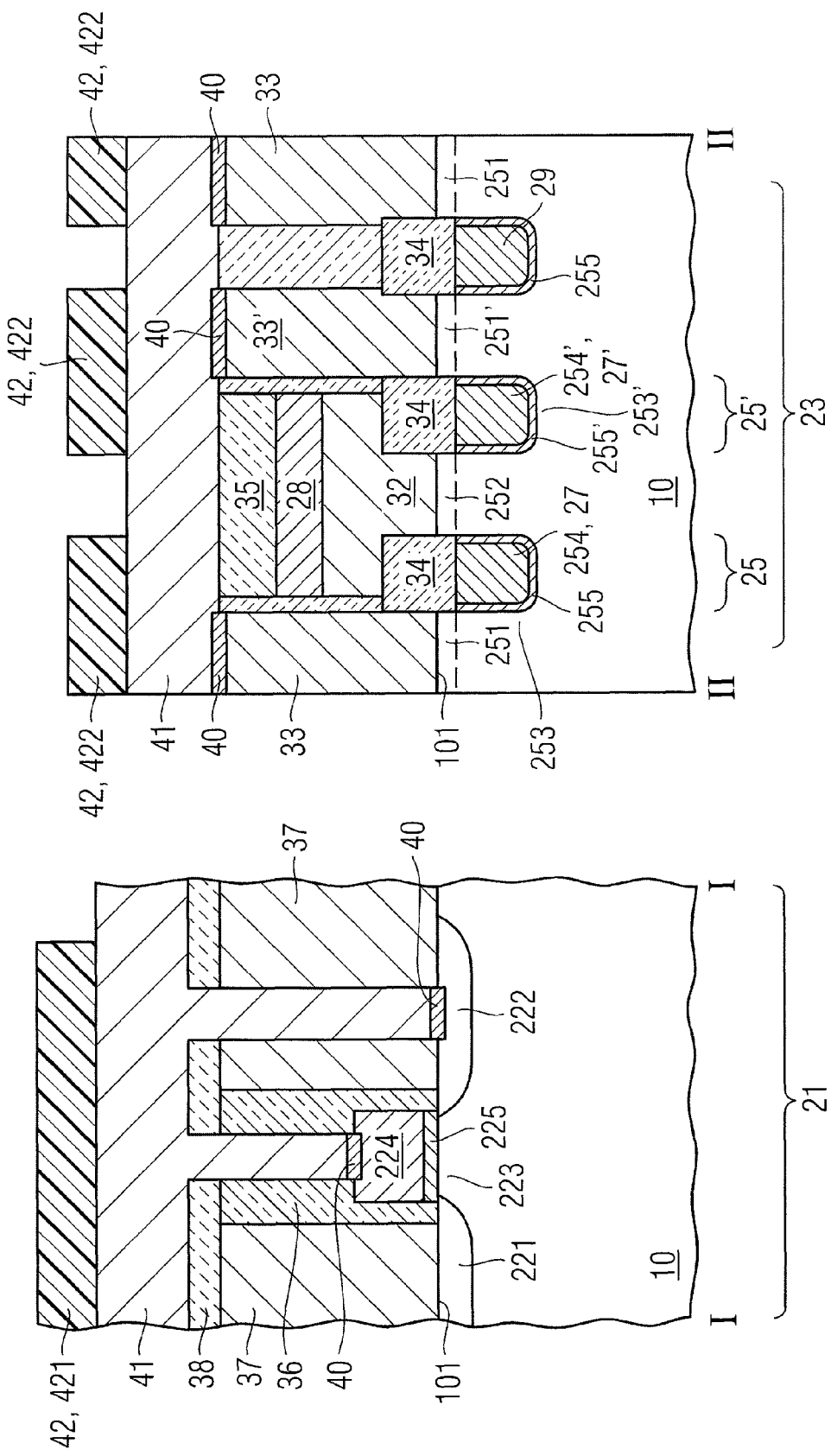

Continuing with FIG. 3E, a masking layer 42 may be provided on the conductive layer 41 in the peripheral region 21 and in the array region 23. The masking layer 42 may be a resist layer system comprising a radiation sensitive resist layer or a hard mask layer. The masking layer 42 may be a layer stack comprising different hard mask layers or a hard mask layer and a resist layer system. The masking layer 42 may be made of any material which allows a patterning selective to the conductive layer 41. The masking layer 42 may be patterned without affecting the conductive layer 41, and the conductive layer 41 may be patterned without severely affecting the masking layer 42. The masking layer 42 may for instance comprise a hard mask layer made of SiN and a positive photo resist layer.

The masking layer 42 may be patterned by carrying out a common lithographic process which is effective both in the peripheral region 21 and in the array region 23. Resulting structures in the masking layer 42 made of the material of the masking layer 42 are wiring line structures 421 in the peripheral region 21 and landing pad structures 422 in the array region 23. The resulting structure is shown in FIG. 3E.

Figure 4A:
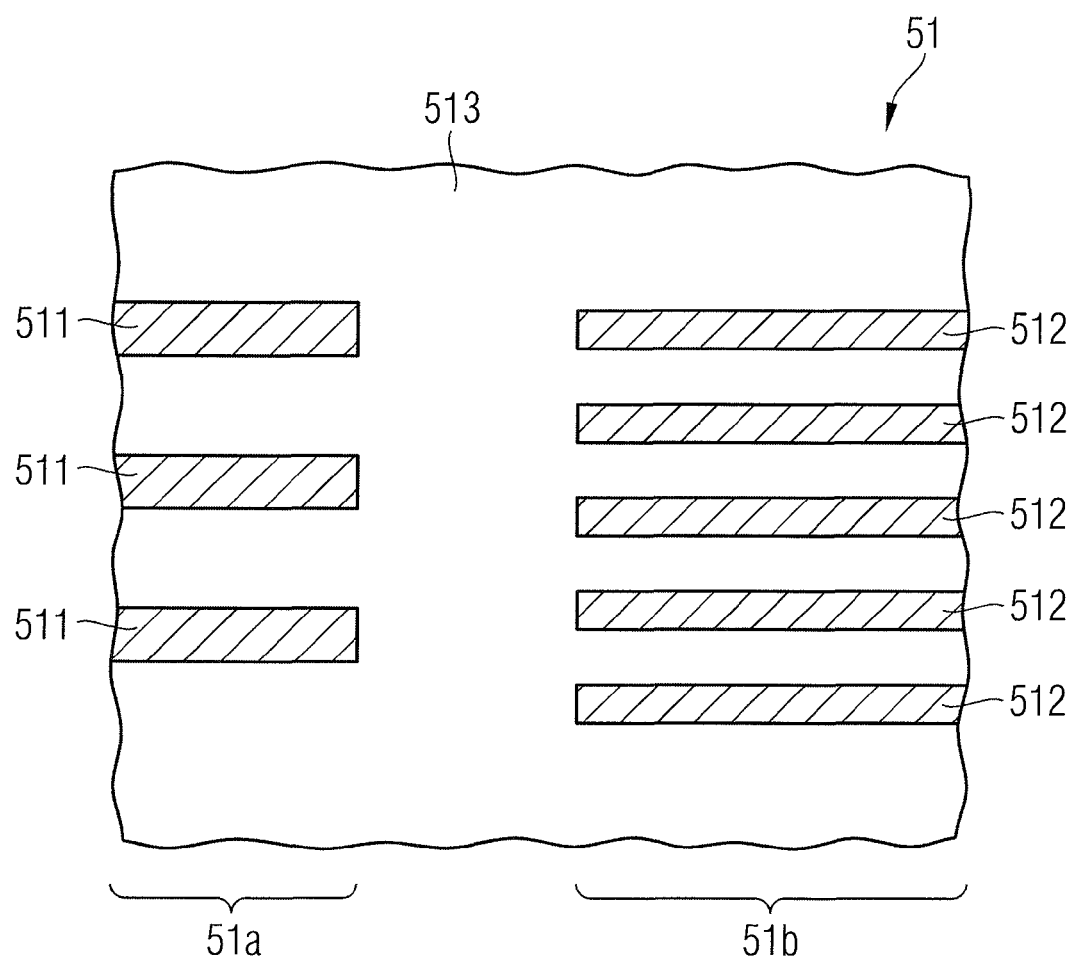
FIG. 4A illustrates a first photomask of a set of photomasks used in the method of FIGS. 3A to 3F.
Figure 4B:
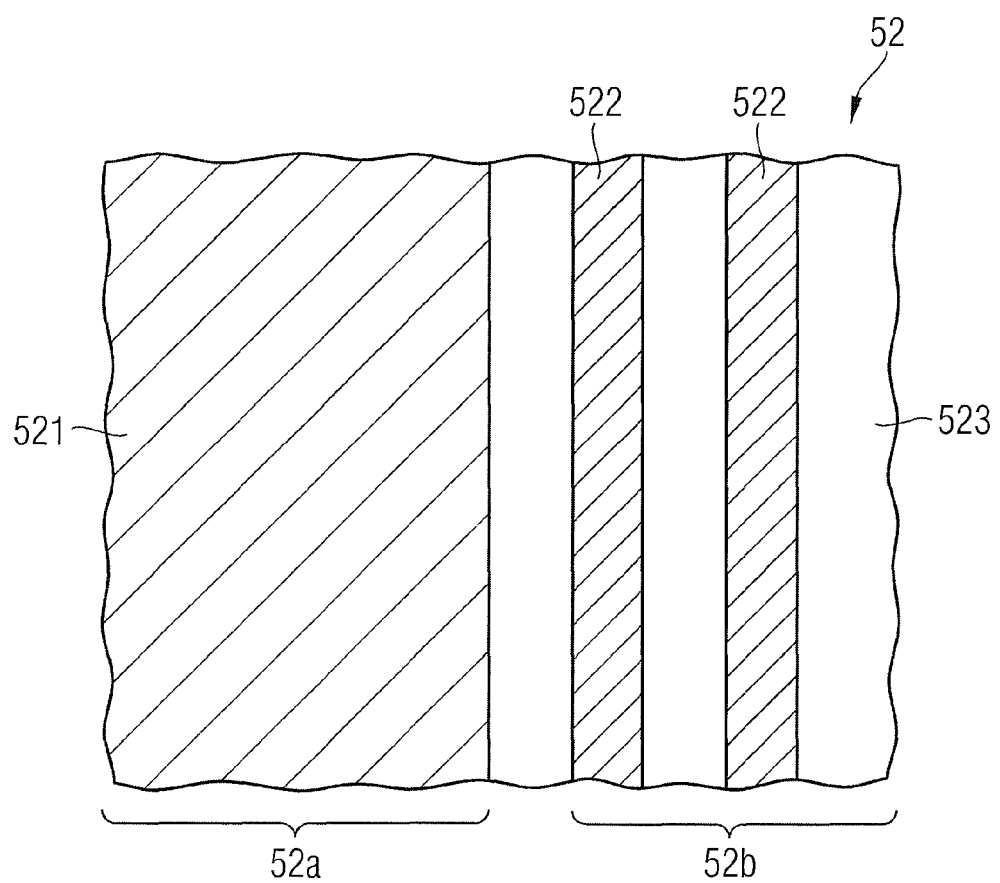
FIG. 4B illustrates a second photomask of a set of photomasks used in the method of FIGS. 3A to 3F.

The common lithographic process may be a double exposure process or a double lithography process as described above. The common lithographic process may be carried out using a photo mask set as shown in FIGS. 4A and 4B. By way of example, FIG. 4A shows a first photo mask 51 used for exposing a first positive resist, whereas FIG. 4B shows a second photo mask 52 used for exposing a second positive resist. The first and the second resist may be the same resist, assumed that the lithographic process is a double exposure process.

The first photo mask 51 comprises opaque wiring line structures 511 in a peripheral portion 51a of the mask 51 corresponding to the peripheral region 21 and opaque first line structures 512 in an array portion 51b corresponding to the array region 23. The opaque structures 511, 512 are separated from each other by a transparent region 513.

The second photo mask 52 comprises an opaque block structure 521 in a peripheral portion 52a of the mask 52 corresponding to the peripheral region 21 and opaque second line structures 522 in an array portion 52b corresponding to the array region 23. The peripheral portion 52a and the array portion 52b are arranged such that they may be overlaid with the peripheral portion 51a and the array portion 51b, respectively, in a double exposure or a double lithographic process. The second line structures 522 intersect the first line structures 512. The opaque structures 521 and 522 are separated from each other by a transparent region 523.

The first and the second photo mask 51, 52 may be formed vice versa such that the first photo mask 51 comprises a block structure according to the block structure 521, and that the second photo mask 52 comprises wiring line structures according to the wiring line structures 511.

As shown in FIG. 3E, in the array region 23 of the substrate 10, masking structures 422 in the shape of rectangular dots are formed at the intersections of the first and the second line structures 512 and 522. In the peripheral portion 21, wiring line structures 421 are formed.

Figure 3F:
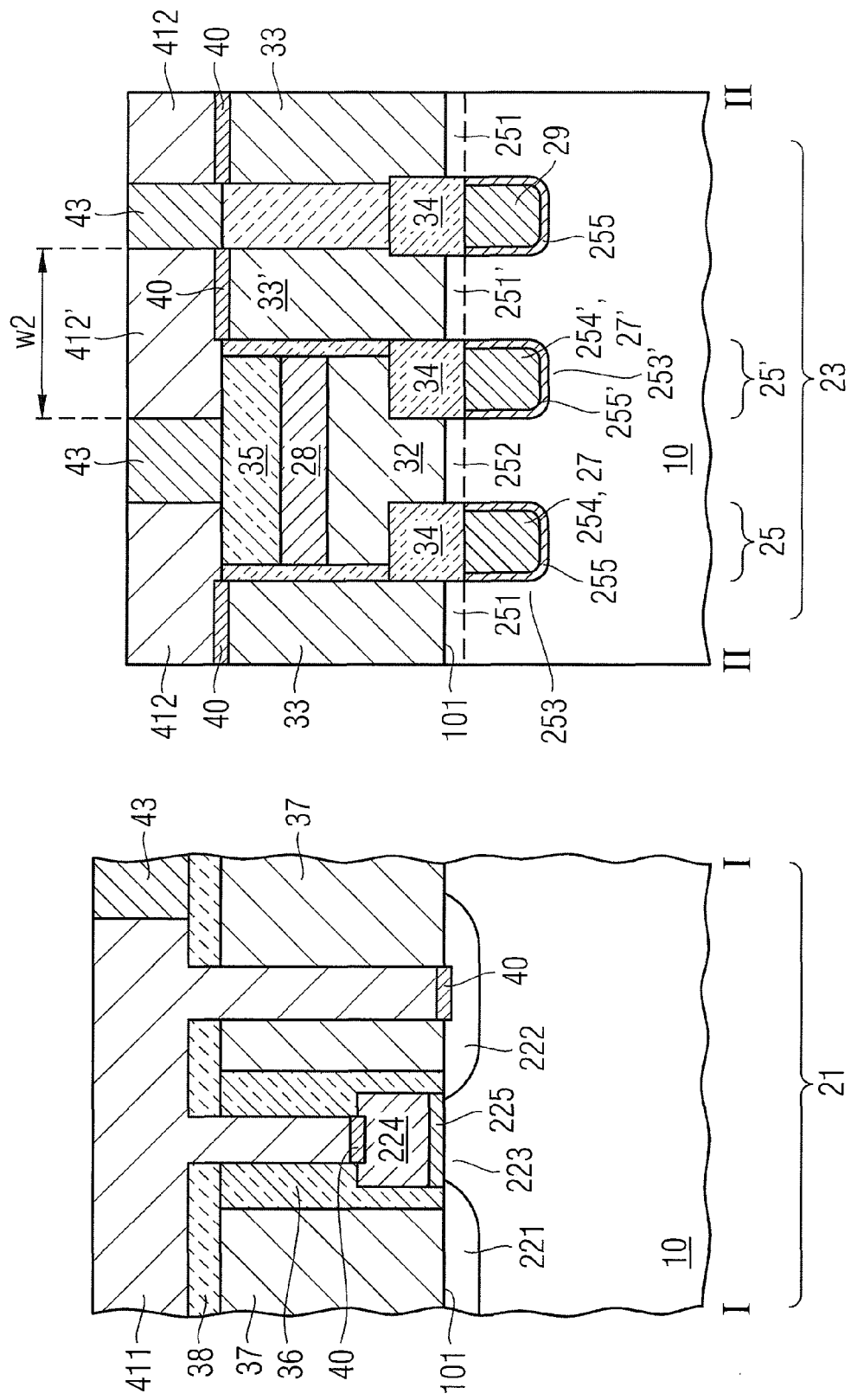

Continuing with FIG. 3F, the patterns in the masking layer 42 may be transferred into the conductive layer 41, for instance by an etch process using the structures in the masking layer 42 as an etching mask. The conductive layer 41 in the peripheral region 21 may be patterned in a common process together with the conductive layer 41 in the array region 23. The transfer of the masking layer 42 into the conductive layer 41 results in wiring lines 411 being formed in the peripheral region 21 and landing pads 412, 412' being formed in the array region 23. The landing pads 412, 412' may have a width w2 measured parallel to the substrate surface 101. W2 may be larger than the width w1 of the contact plugs 33, 33'. W2 may be smaller than 2 F, wherein F denotes the minimum lithographic feature size obtainable with a specific technology. The wiring lines 411 may form a first wiring level (M0) in the peripheral region 21.

Subsequently, the masking layer 42 may be removed and an insulating material 43 may be formed in the spaces between individual wiring lines 411 and individual landing pads 412, 412' and between the peripheral and the array region 21, 23. The insulating material 43 may be any suitable material (e.g., a silicon oxide formed by a CVD process). The resulting structure is shown in FIG. 3F.

The masking layer 42 may be removed from the wiring lines 411 and the landing pads 412, 412' later.

Referring to FIGS. 5A to 5E, another embodiment of the method will be explained using cross-sectional views of an integrated circuit at different stages of processing. The integrated circuit shown in FIGS. 5A to 5E may be a memory device as described with respect to FIG. 2. A substrate comprising access transistors and first and second conductive lines in an array region and control devices in a peripheral region is provided as described with respect to FIGS. 3A and 3B.

Referring to FIG. 5A, an insulating layer 38 may be formed on top of the insulating layers 36 and 37 in the peripheral region 21 as described with respect to FIG. 3C. A masking layer 44 is formed above the peripheral and the array region 21, 23. The masking layer may be made of any suitable material which allows further processing. For instance, an insulating material 43, such as silicon oxide (BPSG, SOD), silicon nitride or others, may serve as the masking layer as shown in FIG. 5A. Furthermore, the masking layer 44 may be a layer stack comprising different materials. The masking layer 44 may comprise different materials in the peripheral and in the array region 21, 23. For example, the masking layer 44 may comprise a first silicon oxide layer, a thin silicon nitride layer with a thickness of about 10 nm, and a second silicon oxide layer with a thickness of 70 to 80 nm in the peripheral region 21, whereas the masking layer 44 may comprise only the first and the second silicon oxide layer in the array region. Nevertheless, the masking layer 44 may be the same in the peripheral and in the array region 21, 23. For sake of simplicity, only one insulating material 43 is shown as the masking layer 44 in FIG. 5A.

As described with respect to FIG. 3C, contact holes 39 may be formed in the peripheral region 21. The resulting structure is shown in FIG. 5A.

Figure 5B:
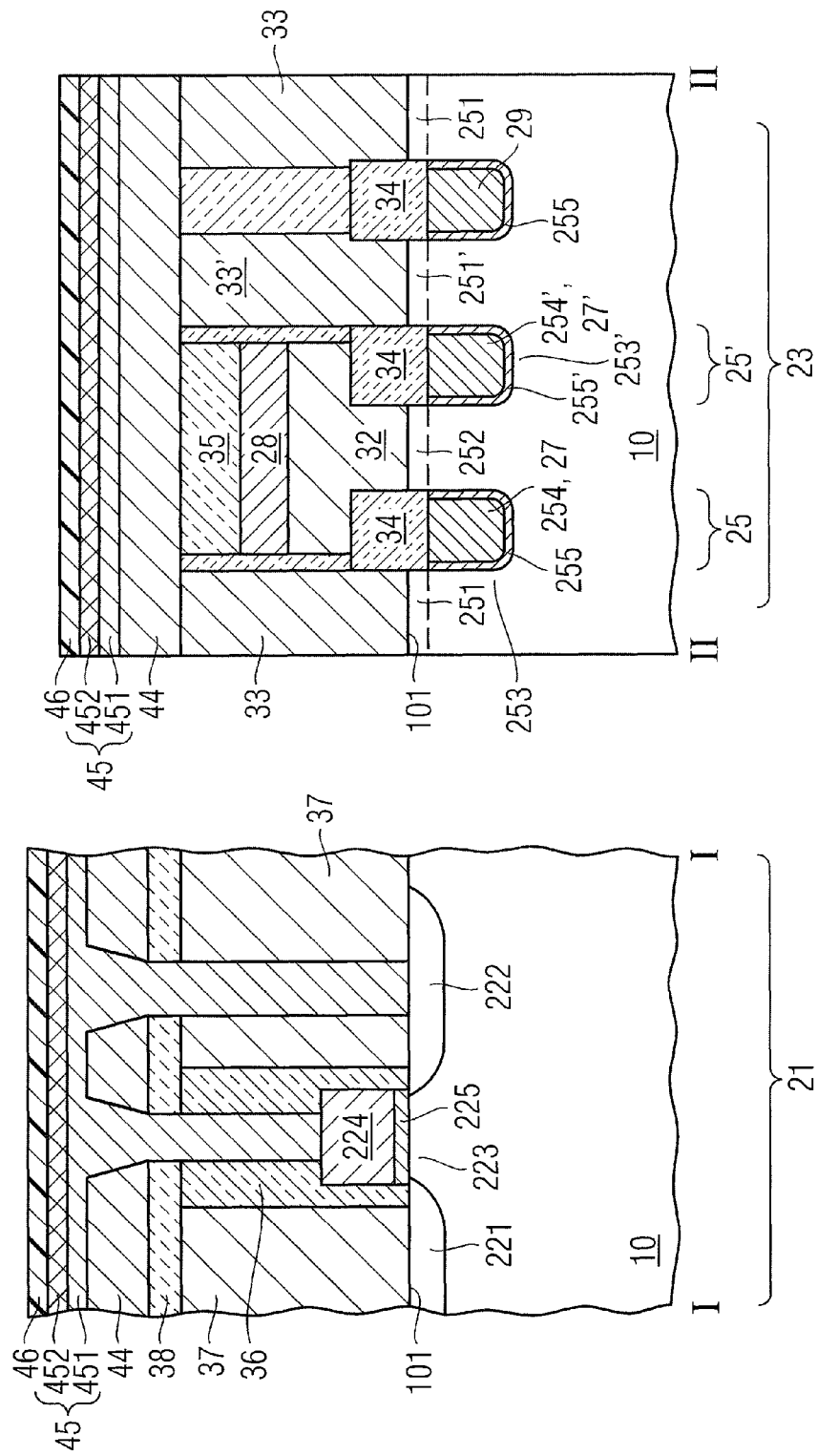

Continuing with FIG. 5B, the masking layer 44 may be patterned by carrying out a common lithographic process which is effective both in the peripheral region 21 and in the array region 23. Resulting structures in the masking layer 44 correspond to wiring line structures in the peripheral region 21 and landing pad structures in the array region 23 as will be described later.

The common lithographic process may be a double lithography process wherein a first exposure process is effective on a first resist layer system and a second exposure process is effective on a second resist layer system. Such a process will be explained with respect to FIGS. 5B to 5D. The common lithographic process may be carried out using a photo mask set as shown in FIGS. 6A and 6B. By way of example, FIG. 6A shows a first photo mask 61 used for exposing a first positive resist, whereas FIG. 6B shows a second photo mask 62 used for exposing a second positive resist.

A further masking layer 45 may be formed above the masking layer 44. The masking layer 45 is used for patterning the masking layer 44 according to predetermined structures. The masking layer 45 may be, for example, a layer stack comprising a first and a second masking layer 451, 452 as shown in FIG. 5B. The first masking layer 451 is disposed on top of the masking layer 44 and the second masking layer 452 is disposed on top of the first masking layer 451. The first masking layer 451 may be a carbon hard mask. The carbon hard mask may be made of elemental carbon, i.e., carbon which is not contained in a chemical compound, optionally including additives such as hydrogen. The carbon hard mask may be deposited using known methods like a CVD-method. Furthermore, the first masking layer 451 may fill the contact holes 39 completely as shown in FIG. 5B. Nevertheless, the contact holes 39 may be filled with another material, for instance a resist material, before providing the first masking layer 451.

The second masking layer 452 may be made of silicon oxide, silicon nitride, silicon oxynitride or any other suitable material. Furthermore, the masking layer 45 may comprise further masking layers disposed on top of the second masking layer 452 or may comprise only one masking layer.

The masking layers 44 and 45 may be made of any material which allows a selective patterning with respect to each other and to the underlying layers. The materials of the masking layers 44 and 45 are selected such that the masking layer 45 may be patterned without affecting the masking layer 44, and such that the masking layer 44 may be patterned without severely affecting the masking layer 45 and the underlying layers.

On top of the masking layer 45 a first resist layer system 46 is disposed. The first resist layer system 46 may comprise for example a radiation sensitive layer, like for instance a positive resist, and an antireflective coating layer. The resulting structure is shown in FIG. 5B.

The first resist layer system 46 may be patterned using a first photo mask 61 and by performing a first lithographic process which is effective both in the peripheral region 21 and in the array region 23. The resulting structure is shown in FIG. 5C.

The first photo mask 61 shown in FIG. 6A comprises a transparent block structure 611 in a peripheral portion 61a of the mask 61 corresponding to the peripheral region 21 and transparent first line structures 612 in an array portion 61b corresponding to the array region 23. The transparent structures 611, 612 are separated from each other by opaque regions 613.

In the result, the first resist layer system 46 is completely removed from the second masking layer 452 in the peripheral region 21, wherein structures (i.e., gaps) 461 are formed in the first resist layer system 46 according to the first line structures 612 in the array region 23, as is shown in FIG. 5C. The first resist layer system 46 is removed from within the structures 461.

Figure 5D:
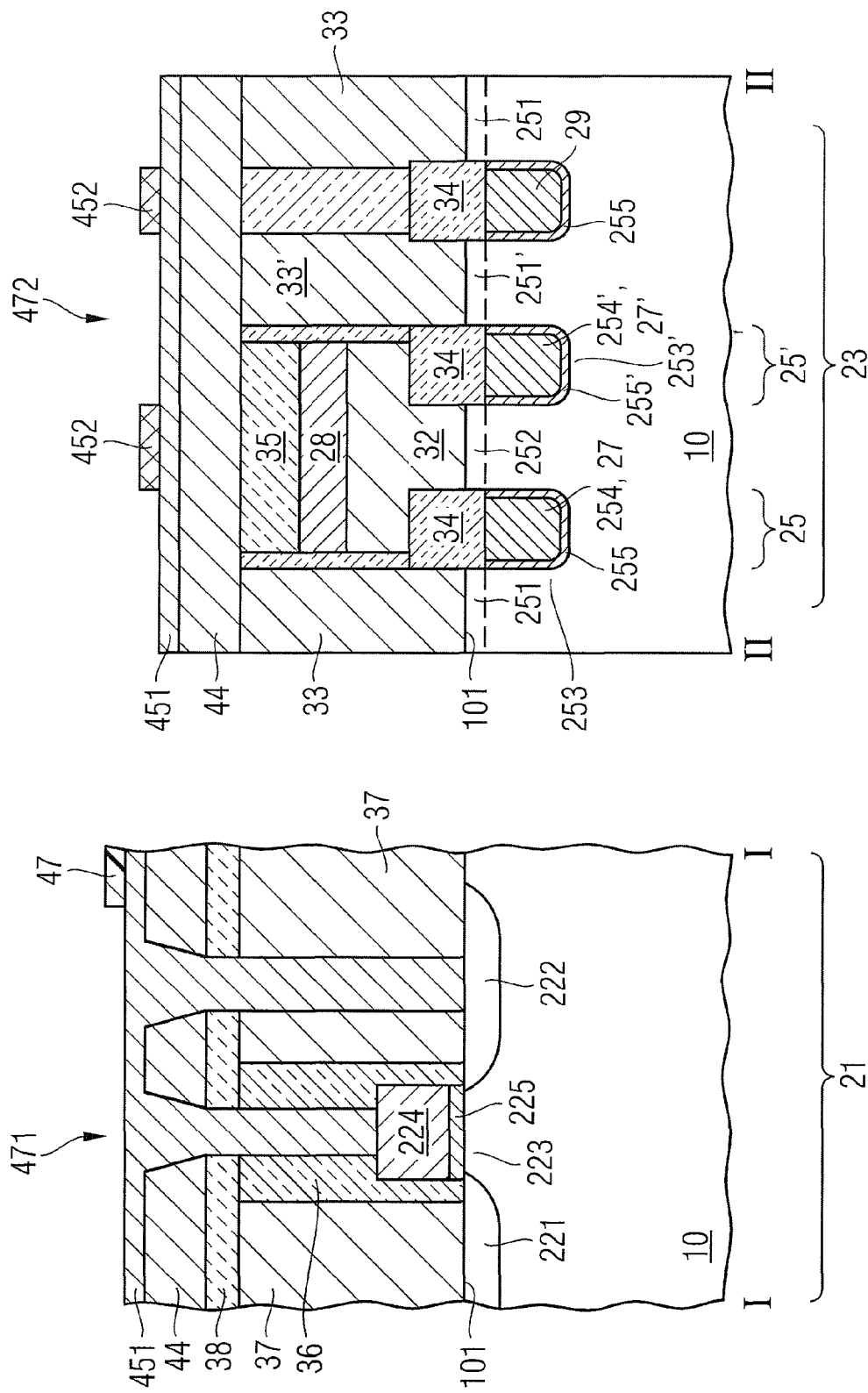
Figure 6B:
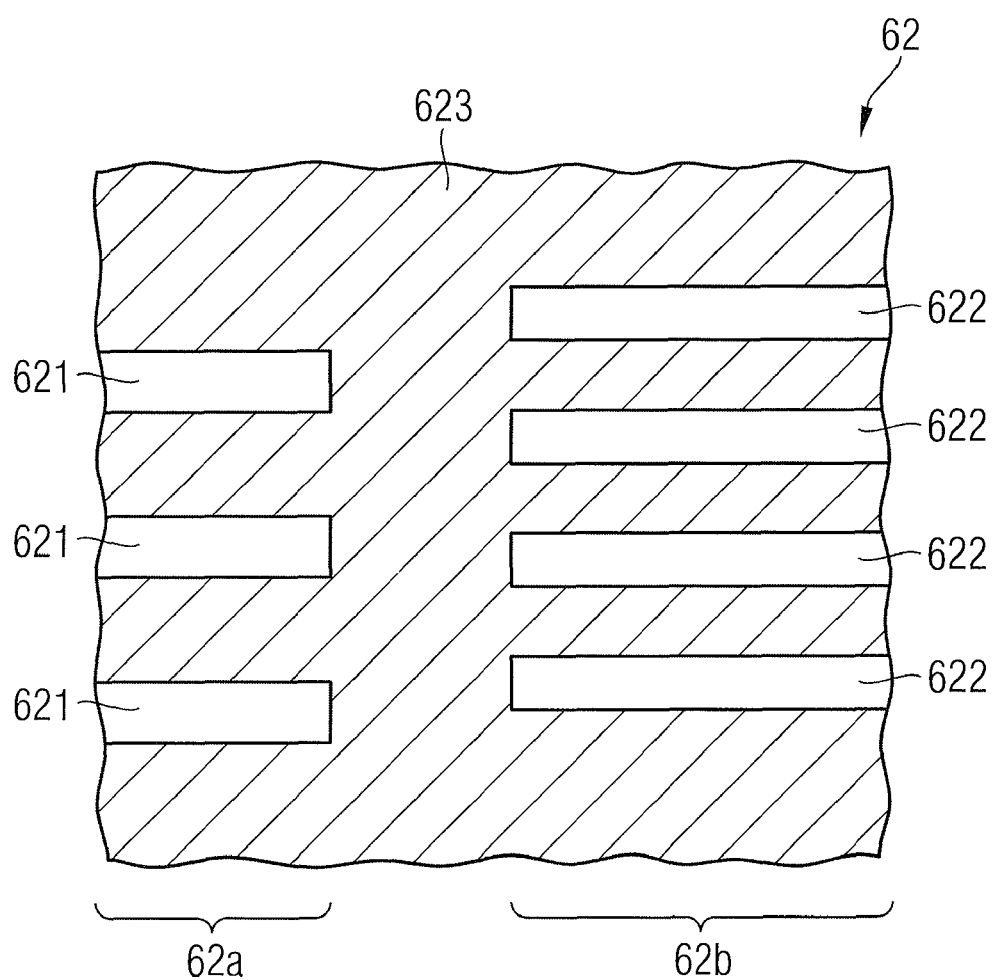
FIG. 6B illustrates a second photomask of a set of photomasks used in the method of FIGS. 5A to 5E.

Referring to FIG. 5D, the second masking layer 452 is patterned according to the structures 461 in the first resist layer system 46, for instance by carrying out an etch process using the patterned first resist layer system 46 as an etching mask. The second masking layer 452 may be completely removed from the first masking layer 451 in the peripheral region 21 and forms first lines in the array region 23 as shown in FIG. 5D.

The first resist layer system 46 may be completely removed and a second resist layer system 47 may be disposed on the resulting surface. The second resist layer system 47 may comprise, for example, a radiation sensitive layer, such as a positive resist, and an antireflective coating layer. The second resist layer system 47 may be patterned using a second photo mask 62 and by carrying out a second lithographic process which is effective both in the peripheral region 21 and in the array region 23. The resulting structure is shown in FIG. 5D.

The second photo mask 62 shown in FIG. 6B comprises a transparent wiring line structures 621 in a peripheral portion 62a of the mask 62 corresponding to the peripheral region 21 and transparent second line structures 622 in an array portion 62b corresponding to the array region 23. The peripheral portion 62a and the array portion 62b are arranged such that they may be overlaid with the peripheral portion 61a and the array portion 61b, respectively, in a double lithographic process. The second line structures 622 intersect the first line structures 612. The transparent structures 621, 622 are separated from each other by an opaque region 623.

The resulting structures (i.e., gaps) 471, according to the wiring line structures 621, are formed in the second resist layer system 47 in the peripheral region 21. In the array region 23, the resulting structures (i.e., gaps) 472, according to the second line structures 622, are formed in the second resist layer system 47. The second resist layer system 47 is completely removed from the first and the second masking layer 451, 452 within the structures 471, 472. Since a cross sectional view along one structure 472 is shown on the right side of FIG. 5D, no second resist layer system 47 is shown in the array region 23.

According to FIG. 5E, the structures 471, 472 in the second resist layer system 47 are transferred into the first and the second masking layer 451, 452, for instance by carrying out an etch process using the patterned second resist layer system 47 as an etching mask. The second resist layer system 47 may be completely removed, and the structures in the masking layer 45 may be transferred into the masking layer 44, wherein the resulting structures (i.e., gaps) 441, 442 are formed within the masking layer 44. According to another embodiment, the masking layer 45 and the first and the second resist layer systems 46, 47 may be saved if the masking layer 44 can be patterned in another way. Structures 441, 442 formed within the masking layer 44 are trenches having the shape of wiring lines in the peripheral region 21 and are holes having the shape of landing pads in the array region 23. The masking layer 44 or any other material is completely removed from the contact holes 39 in the peripheral region 21 and from surfaces of the contact plugs 33, 33'. The resulting structure is shown in FIG. 5E.

A conductive material 41, as described with respect to FIG. 3D, is deposited on the peripheral and the array region 21, 23 to form wiring lines 411 in the peripheral portion 21 and landing pads 412, 412' in the array region 23. The conductive material 41 fills the contact holes 39 in the peripheral region 21 and fills at least partially the structures (i.e., gaps) 441, 442 within the masking layer 44 in the peripheral and the array region 21, 23. The conductive material 41 covers the whole surface of the underlying layers which is exposed within the structures 441, 442 in the masking layer 44. Partially means, that the thickness of the conductive material 41 may be smaller than the thickness of the masking layer 44. According to another embodiment, the thickness of the conductive material 41 may be the same as the thickness of the masking layer 44. By way of example, the conductive material 41 may be disposed as a thick layer completely filling the structures in the masking layer 44 and extending above the masking layer 44. The conductive material 41 disposed above the masking layer 44 may be removed, for instance by a planarization process like a CMP-process, wherein the masking layer 44 is used as a planarization stop.

If the contact plugs 33 are made of a semiconductor material, optionally a metal-semiconductor compound 40 may be formed before providing the conductive material 41 as described with respect to FIG. 3D.

If the masking layer 44 is made of an insulating material 43, if the conductive material 41 completely fills the structures in the masking layer 44 and if a metal-semiconductor compound 40 is formed as described above, the resulting structure of the embodiment of the method is similar to that shown in FIG. 3F.

The resulting integrated circuit, shown for example in FIG. 3F, comprises a plurality of devices, for instance access transistors 25, 25', in the array region 23 and a plurality of contact structures, each contact structure comprising a contact plug 33, 33' in contact with a portion of one of the devices and a landing pad 412, 412'. Each landing pad is arranged above one contact plug and is in electrical contact with this contact plug. The integrated circuit further comprises a peripheral region 21 comprising a wiring layer comprising wiring lines 411, wherein the wiring lines 411 are self-aligned to the landing pads 412, 412' in at least one direction the landing pads are extending in. The self-alignment results from the common lithographic process, where wiring line structures in the peripheral region and first or second line structures in the array region are exposed using one common photo mask. The first or the second line structures in the array region trim the extension of the resulting landing pads in one direction.

The wiring layer comprising the wiring lines 411 in the peripheral region 21 is arranged at the same wiring level as the landing pads 412, 412' in the array region 23. An upper surface of the wiring lines 411 may be arranged at the same height above the substrate surface 101 as an upper surface of the landing pads 412, 412'. A lower surface of the wiring lines 411 may be arranged at the same height above the substrate surface 101 as a lower surface of the landing pads 412, 412'. An insulating material 37 may be arranged above the substrate surface 101 in the peripheral region 21, wherein an upper surface of the insulating layer 37 is at the same height as an upper surface of the contact plugs 33, 33' in the array region, and an additional layer 38 may be arranged between the insulating layer 37 and the wiring layer in the peripheral region 21. The wiring lines 411 and the landing pads 412, 412' may be made of a common conductive material 41 showing the same material properties, such as grain size, microstructure and chemical composition.

The processing of the integrated circuit described with respect to FIGS. 3A to 3F or 5A to 5E may be continued in order to manufacture a memory device as described with respect to FIG. 2. In particular, storage capacitors 26, 26' may be formed above the access transistors 25, 25' in the array region 23. The structure described with respect to FIG. 3F is provided, wherein a surface of the landing pads 412, 412' is exposed. First conductive lines 27 and second conductive lines 28 are already formed beneath a wiring level of the landing pads 412, 412' in the array region 23.

Storage capacitors 26, 26' are formed as stacked capacitors known to persons skilled to the art. In particular, a first conductive material is disposed on top of the landing pads 412, 412' to form first capacitor electrodes 261, 261'. Neighboring first capacitor electrodes 261 and 261' are separated from each other by forming an insulating material 48. A dielectric material is disposed on top of the first capacitor electrodes 261, 261' to form a capacitor dielectric 263. A second conductive material is disposed on top of the capacitor dielectric 263 to form second capacitor electrodes 262, which may be formed as a common electrode for a plurality of storage capacitors 26, 26'. The resulting structure is shown in FIG. 7.

The materials and the dimensions of the first and second capacitor electrodes 261, 261' and 262, of the capacitor dielectric 263, and of the insulating material 48 may be selected according to requirements of the fabrication process and to desired device parameters.

In the peripheral region 21, an insulating material 49 may be formed above a plane of the wiring lines 411 as shown in FIG. 7. Further wiring levels and contacts, for instance to the first wiring level, (not shown) may be formed within the insulating material 49.

The first capacitor electrodes 261, 261' are electrically connected with the first source/drain regions 251, 251' of the access transistors 25, 25' via the contact plugs 33, 33', the optional metal-semiconductor compound 40 and the landing pads 412, 412', respectively. Since the width w2 of the landing pads 412, 412' is larger than the width w1 of the contact plugs 33, 33', a transformation of a first geometry of the contact plugs 33, 33' into a second geometry of the storage capacitors 26, 26' is obtained in a reliable way. Furthermore, a larger contact area of the storage capacitors 26, 26' to the access transistors 25, 25' may be obtained with respect to the contact area of the contact plugs 33, 33' resulting in a decreasing contact resistance and in a decreasing response time.

Figure 8:
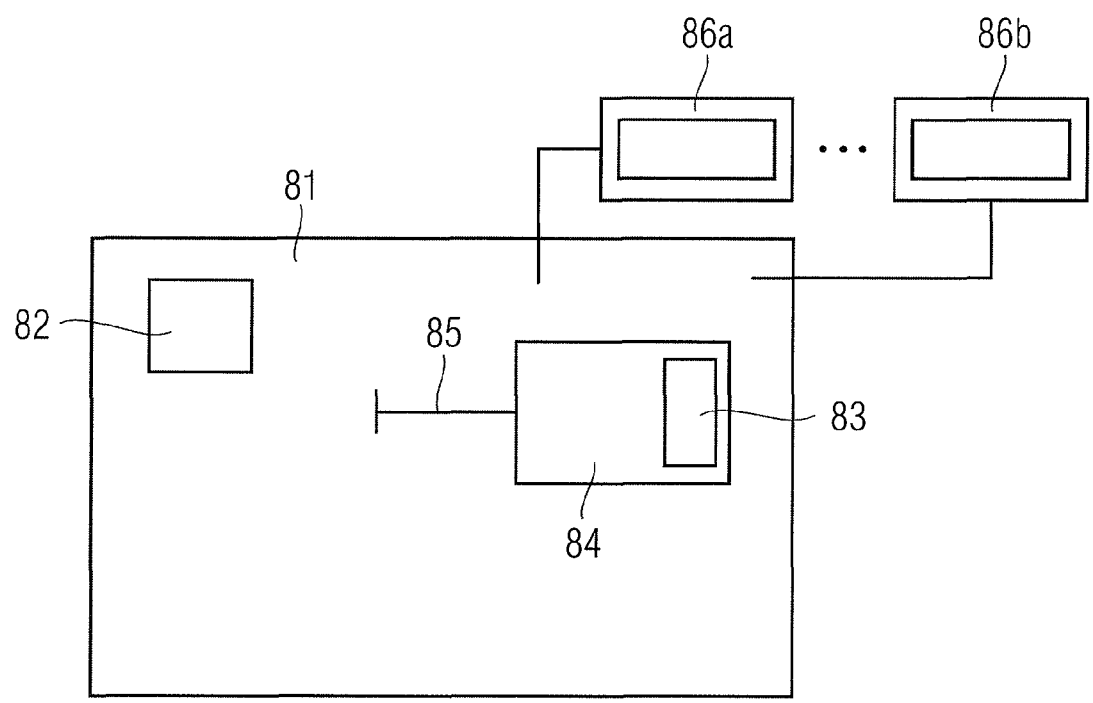
FIG. 8 illustrates a system comprising an exemplary embodiment of the described integrated circuit.

FIG. 8 schematically shows an electronic device 81 according to an exemplary embodiment. As is shown in FIG. 8, the electronic device 81 may comprise an interface 85 and a component 84 which is adapted to be interfaced by the interface 85. The electronic device 81, for example the component 84, may comprise an integrated circuit 83 or a memory device as has been explained above. The component 84 may be connected in an arbitrary manner with the interface 85. For example, the component 84 may be externally placed and may be connected with the device 81 by the interface 85. Moreover, the component 84 may be housed inside the electronic device 81 and may be connected with the interface 85. By way of example, it is also possible that the component 84 is removably placed into a slot which is connected with the interface 85. When the component 84 is inserted into the slot, a memory device or integrated circuit 83 is interfaced by the interface 85. The electronic device 81 may further comprise a processing device 82 for processing data. In addition, the electronic device 81 may further comprise one or more display devices 86a, 86b for displaying data. The electronic device may further comprise components which are configured to implement a specific electronic system. Examples of the electronic system include: a computer (e.g., a personal computer or a notebook), a server, a router, a game console (e.g., a video game console or a portable video game console), a graphics card, a personal digital assistant, a digital camera, a cell phone, an audio system (e.g., any kind of music player) or a video system. For example, the electronic device 81 may be a portable electronic device.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of manufacturing an integrated circuit, the method comprising:
   forming landing pads in an array region of a substrate, individual ones of the landing pads being electrically coupled to individual ones of portions of devices formed in the substrate in the array region; and
   forming wiring lines within a peripheral region of the substrate;
   wherein forming the landing pads and forming the wiring lines comprises a common lithographic process being effective both in the array and peripheral regions and comprising:
   a first lithographic exposure process using a first mask comprising first line structures in an array portion corresponding to the array region and wiring line structures in a peripheral portion corresponding to the peripheral region; and
   a second lithographic exposure process using a second mask with second line structures in the array portion corresponding to the array region and with a block structure in the peripheral portion corresponding to the peripheral region, the second line structures intersecting the first line structures,
   wherein intersecting portions of the first and the second line structures correspond to the landing pads.

2. The method of claim 1, further comprising:
   forming contact plugs in the array region before forming the landing pads, lower surfaces of the individual ones of the contact plugs being in contact with individual ones of the portions of the devices and upper surfaces of the individual ones of the contact plugs being in contact with individual ones of the landing pads.

3. The method of claim 1, wherein forming the landing pads and forming the wiring lines further comprises:
   patterning a layer of a conductive material disposed in the peripheral region and in the array region such that the conductive material is electrically coupled to the portions of the devices.

4. The method of claim 1, further comprising:
   providing a conductive layer above the peripheral region and the array region before carrying out the common lithographic process, the conductive layer being electrically coupled to the portions of the devices;
   providing a masking layer above the conductive layer and patterning the masking layer by carrying out the common lithographic process to form landing pad structures within the masking layer in the array region and wiring line structures within the masking layer in the peripheral region; and patterning the conductive layer using the patterned masking layer as an etching mask.

5. The method of claim 4, further comprising:
forming contact portions comprising a semiconductor material, the contact portions being exposed at a top surface of the array region and electrically coupling the conductive layer to the portions of the devices; and
forming a metal-semiconductor compound before providing the conductive layer.

6. The method of claim 1, further comprising:
providing a masking layer above the peripheral region and the array region before carrying out the common lithographic process;
patterning the masking layer by carrying out the common lithographic process, thereby forming structures in the masking layer, the structures being holes having the shape of the landing pads in the array region and being trenches having the shape of the wiring lines in the peripheral region; and
at least partially filling the structures in the masking layer with a conductive material.

7. The method of claim 6, further comprising:
forming contact portions in the array region, the contact portions being electrically coupled to the portions of the devices;
wherein the structures in the array region extend to an upper surface of the contact portions.

8. The method of claim 7, further comprising:
forming a metal-semiconductor compound in the structures above the contact portions before filling the structures with the conductive material;
wherein the contact portions comprise a semiconductor material.

9. The method of claim 1, wherein the first and second lithographic exposure processes are effective on one resist layer system.

10. The method of claim 1, wherein the first lithographic exposure process is effective on a first resist layer system and the second lithographic process is effective on a second resist layer system.

11. The method of claim 1, wherein the devices formed in the array region are access transistors of memory cells and the portions of the devices are source/drain regions of the transistors, the method further comprising:
forming first and second conductive lines in the array region, individual ones of the access transistors being configured to be addressed by at least one first and one second conductive line; and
forming storage capacitors above the access transistors in the array region, individual ones of the storage capacitors being electrically coupled to individual ones of the landing pads.

* * * * *